US012609084B2

(12) United States Patent
Bang et al.

(10) Patent No.: US 12,609,084 B2
(45) Date of Patent: *Apr. 21, 2026

(54) DISPLAY DEVICE

(71) Applicant: SAMSUNG DISPLAY CO., LTD.,
Yongin-si (KR)

(72) Inventors: Jeong Hun Bang, Yongin-si (KR); **Ji
Hyun Ka, Yongin-si (KR); Kyung
Hoon Kim, Yongin-si (KR); Joong Soo
Moon, Yongin-si (KR); Jae Sic Lee**,
Yongin-si (KR); Jae Yong Lee,
Yongin-si (KR)

(73) Assignee: Samsung Display Co., Ltd., Yongin-si
(KR)

( * ) Notice: Subject to any disclaimer, the term of this
patent is extended or adjusted under 35
U.S.C. 154(b) by 0 days.

This patent is subject to a terminal dis-
claimer.

(21) Appl. No.: 18/974,728

(22) Filed: Dec. 9, 2024

(65) Prior Publication Data

US 2025/0104637 A1 Mar. 27, 2025

Related U.S. Application Data

(63) Continuation of application No. 18/543,226, filed on
Dec. 18, 2023, now Pat. No. 12,165,592.

(30) Foreign Application Priority Data

Mar. 22, 2023 (KR) ........................ 10-2023-0037598
Jun. 9, 2023 (KR) ........................ 10-2023-0074125

(51) Int. Cl.
*G09G 3/3233* (2016.01)
*H10K 59/131* (2023.01)
(52) U.S. Cl.
CPC ......... *G09G 3/3233* (2013.01); *H10K 59/131*
(2023.02); *G09G 2300/0413* (2013.01);
(Continued)

(58) Field of Classification Search
CPC ......... G09G 3/3233; G09G 2300/0413; G09G
2300/0426; G09G 2300/0452;
(Continued)

(56) References Cited

U.S. PATENT DOCUMENTS 11,991,910 B2 5/2024 Du et al.
12,022,701 B2 6/2024 Du et al.
(Continued)

FOREIGN PATENT DOCUMENTS

CN 114373774 4/2022
CN 114695491 7/2022
(Continued)

OTHER PUBLICATIONS

Extended European Search Report issued in corresponding EP
Application No. 24164961.5, dated Aug. 16, 2024, 9 pages.

*Primary Examiner* — Jonathan A Boyd
(74) *Attorney, Agent, or Firm* — Womble Bond Dickinson
(US) LLP

(57) ABSTRACT

There is provided a display device including a substrate, a
circuit layer, and an element layer. A display area of the
substrate includes a main display area in which emission
areas are arranged side by side, and at least one sub-display
area surrounded by the main display area. The at least one
sub-display area further includes light transmission areas
located between the emission areas. The circuit layer
includes light-emitting pixel drivers respectively electrically
connected to the light-emitting elements of the element
layer, data lines transmitting data signals to the light-emit-
ting pixel drivers, first dummy lines extending in a first
direction intersecting the data lines, and second dummy
lines extending parallel to the data lines and paired with the
data lines, respectively. The second dummy lines include (Continued)

reset transmission lines extending from the non-display area to the at least one sub-display area.

12 Claims, 16 Drawing Sheets

(52) U.S. Cl.
CPC ............... *G09G 2300/0426* (2013.01); *G09G 2300/0452* (2013.01); *G09G 2300/0819* (2013.01); *G09G 2300/0852* (2013.01); *G09G 2320/0233* (2013.01)

(58) Field of Classification Search
CPC ... G09G 2300/0819; G09G 2300/0852; G09G 2320/0233; H10K 59/131
See application file for complete search history.

(56) References Cited

U.S. PATENT DOCUMENTS

| | | | |
|---|---|---|---|
| 2022/0077265 A1 | 3/2022 | Ma et al. | |
| 2023/0006015 A1 | 1/2023 | Sun et al. | |
| 2023/0054978 A1 | 2/2023 | Cao et al. | |
| 2023/0110850 A1 | 4/2023 | Wang et al. | |
| 2023/0178704 A1 | 6/2023 | Gu et al. | |
| 2023/0200165 A1 | 6/2023 | Ma | |

FOREIGN PATENT DOCUMENTS

| | | |
|---|---|---|
| CN | 115346443 | 11/2022 |
| CN | 115666182 | 1/2023 |
| KR | 10-2282938 B1 | 7/2021 |
| WO | WO 2022-110736 | 6/2022 |

100: DA, NDA, SBA
DA: MDA, SBDA
MDA: DEA, GA

DML1: TDEL1, ASL1
DML2: TDEL2, ASL2

DL: DL1, DL2, DL3
DSPL: DSPL1, DSPL2, DSPL3

FIG. 13

DISPLAY DEVICE

CROSS-REFERENCE TO RELATED APPLICATIONS

The application is a continuation of U.S. patent application Ser. No. 18/543,226, filed Dec. 18, 2023, which claims priority to and the benefit of Korean Patent Application No. 10-2023-0037598, filed Mar. 22, 2023, and Korean Patent Application No. 10-2023-0074125, filed Jun. 9, 2023, the entire content of all of which is incorporated herein by reference.

BACKGROUND

1. Field

The present disclosure relates to a display device.

2. Description of Related Art

With the advance of information-oriented society, more and more demands are placed on display devices for displaying images in various ways. For example, display devices are employed in various electronic devices, such as smartphones, digital cameras, laptop computers, navigation devices, and smart televisions.

The display device may be a flat panel display device, such as a liquid crystal display device, a field emission display device and a light-emitting display device. Examples of the light-emitting display device may include an organic light-emitting display device including organic light-emitting elements, an inorganic light-emitting display device including inorganic light-emitting elements, such as inorganic semiconductors, and a micro light-emitting display device including micro light-emitting elements.

The organic light-emitting display device displays an image using light-emitting elements, each including a light-emitting layer made of an organic light-emitting material. As described above, the organic light-emitting display device implements image display using a self-light-emitting element, and thus may have relatively superior performance in power consumption, response speed, luminous efficiency, luminance, and wide viewing angle compared to other display devices.

One surface of the display device may be a display surface including a display area in which an image is displayed and a non-display area that is a periphery of the display area. Emission areas emitting light with respective luminances and colors may be arranged in the display area.

SUMMARY

The display device may be provided in various designs according to various electronic devices.

For example, a display device tailored to an electronic device including an optical device, such as a smartphone or a tablet device, may include a hole overlapping the optical device. Light incident through such a hole may be detected by a camera sensor.

In this case, there arises a problem that the ratio of the display area in the display surface decreases as the width of the non-display area increases due to the arrangement of the hole overlapping the optical device.

In view of the foregoing, aspects of the present disclosure provide a display device that can be adapted to an electronic device including an optical device without a hole overlapping the optical device, thus capable of maintaining a proper ratio of a display area in a display surface.

According to an aspect of the present disclosure, there is provided a display device including a substrate including a display area including emission areas, and a non-display area around the display area, a circuit layer above the substrate, and an element layer above the circuit layer, and including light-emitting elements respectively corresponding to the emission areas, wherein the display area includes a main display area in which the emission areas are arranged side by side, and at least one sub-display area surrounded by the main display area, wherein the at least one sub-display area further includes light transmission areas between the emission areas, and wherein the circuit layer includes light-emitting pixel drivers respectively electrically connected to the light-emitting elements of the element layer, data lines for transmitting data signals to the light-emitting pixel drivers, first dummy lines extending in a first direction crossing the data lines, and second dummy lines extending parallel to the data lines, respectively paired with the data lines, and including reset transmission lines extending from the non-display area to the at least one sub-display area.

The display device may further include a display driving circuit for outputting the data signals of the data lines, wherein the circuit layer further includes data supply lines in the non-display area, and electrically connected to the display driving circuit, wherein a bypass area on one side of the display area includes a bypass middle area, a first bypass side area parallel to the bypass middle area in the first direction and contacting the non-display area, and a second bypass side area between the bypass middle area and the first bypass side area, wherein the data lines include a first data line in the first bypass side area, and a second data line in the second bypass side area, wherein the first dummy lines include a first transmission bypass line electrically connected to the first data line, wherein the second dummy lines further include a second transmission bypass line paired with the second data line and electrically connected to the first transmission bypass line, wherein, among the data supply lines, a first data supply line for transmitting a first data signal of the first data line is electrically connected to the first data line through the first transmission bypass line and the second transmission bypass line, and a second data supply line for transmitting a second data signal of the second data line is directly electrically connected to the second data line.

The circuit layer may further include a first power supply line and a second power supply line for respectively transmitting a first power and a second power for driving the light-emitting elements, wherein the first dummy lines further include first auxiliary lines electrically connected to the second power supply line, and wherein the second dummy lines further include second auxiliary lines electrically connected to the first auxiliary lines and the second power supply line.

Two of the first auxiliary lines may extend from respective sides of the first transmission bypass line to the non-display area, wherein one of the second auxiliary lines extends from one side of the second transmission bypass line to the non-display area.

Among the light-emitting pixel drivers, one light-emitting pixel driver in the main display area may include a first transistor for generating a driving current for driving one of the light-emitting elements, a second transistor electrically connected between one of the data lines and a first electrode of the first transistor, a third transistor electrically connected between a gate electrode of the first transistor and a second electrode of the first transistor, a fourth transistor electrically connected between a first initialization power line for transmitting a first initialization power and the gate electrode of the first transistor, a fifth transistor electrically connected between a first power line for transmitting the first power and the first electrode of the first transistor, a sixth transistor electrically connected between the second electrode of the first transistor and the one light-emitting element, a seventh transistor electrically connected between a second initialization power line for transmitting a second initialization power and the one light-emitting element, and an eighth transistor electrically connected between a bias power line for transmitting a bias power and the first electrode of the first transistor.

The at least one sub-display area may overlap at least one optical device.

Among the light-emitting pixel drivers, another light-emitting pixel driver in the at least one sub-display area may be electrically connected to another light-emitting element among the light-emitting elements, wherein the display device further includes a reset unit configured to transmit a reset power to the another light-emitting element via a reset power line based on a reset control signal of a reset control line.

The reset unit may include a ninth transistor electrically connected between the reset power line and the another light-emitting element, wherein a gate electrode of the ninth transistor is electrically connected to a reset control line for transmitting the reset control signal.

The circuit layer may further include a reset power supply line in the non-display area for transmitting the reset power, and a reset control supply line in the non-display area for transmitting the reset control signal, wherein the reset transmission lines include a reset power transmission line electrically connecting the reset power supply line and the reset power line, and a reset control transmission line electrically connecting the reset control supply line and the reset control line.

Two adjacent ones of the second dummy lines may be located between, and are respectively paired with, two of the data lines respectively overlapping two adjacent ones of the light-emitting pixel drivers.

The second dummy lines may further include an offset line adjacent to the reset control transmission line for transmitting an offset signal having a polarity that is opposite to that of the reset control signal.

According to an aspect of the present disclosure, there is provided a display device including a substrate including a display area including emission areas, and a non-display area around the display area, a circuit layer above the substrate, and an element layer above the circuit layer, and including light-emitting elements respectively corresponding to the emission areas, wherein the display area includes a main display area in which the emission areas are arranged side by side, and at least one sub-display area surrounded by the main display area, and overlapping at least one optical device under the substrate, wherein the circuit layer includes light-emitting pixel drivers respectively electrically connected to the light-emitting elements of the element layer, data lines for transmitting data signals to the light-emitting pixel drivers, first dummy lines extending in a first direction crossing the data lines, second dummy lines extending parallel to the data lines, and respectively paired with the data lines, data supply lines in the non-display area, and electrically connected to a display driving circuit for outputting data signals of the data lines, and a first power supply line and a second power supply line for respectively transmitting a first power and a second power for driving the light-emitting elements, wherein a bypass area on one side of the display area includes a bypass middle area, a first bypass side area parallel to the bypass middle area in the first direction and contacting the non-display area, and a second bypass side area between the bypass middle area and the first bypass side area, wherein the data lines include a first data line in the first bypass side area, and a second data line in the second bypass side area, wherein the first dummy lines include a first transmission bypass line electrically connected to the first data line, and first auxiliary lines electrically connected to the second power supply line, and wherein the second dummy lines include a second transmission bypass line paired with the second data line, and electrically connected to the first transmission bypass line, reset transmission lines extending from the non-display area to the at least one sub-display area, and second auxiliary lines electrically connected to the first auxiliary lines and the second power supply line.

Among the light-emitting pixel drivers, one light-emitting pixel driver in the main display area may include a first transistor for generating a driving current for driving one of the light-emitting elements, a second transistor electrically connected between one of the data lines and a first electrode of the first transistor, a third transistor electrically connected between a gate electrode of the first transistor and a second electrode of the first transistor, a fourth transistor electrically connected between a first initialization power line for transmitting a first initialization power and the gate electrode of the first transistor, a fifth transistor electrically connected between a first power line for transmitting the first power and the first electrode of the first transistor, a sixth transistor electrically connected between the second electrode of the first transistor and the one light-emitting element, a seventh transistor electrically connected between a second initialization power line for transmitting a second initialization power and the one light-emitting element, and an eighth transistor electrically connected between a bias power line for transmitting a bias power and the first electrode of the first transistor.

Among the light-emitting pixel drivers, another light-emitting pixel driver in the at least one sub-display area may be electrically connected to another light-emitting element among the light-emitting elements, wherein the display device further includes a reset unit configured to transmit a reset power to the another light-emitting element via a reset power line based on a reset control signal of a reset control line, wherein the circuit layer further includes a reset power supply line in the non-display area for transmitting the reset power, and a reset control supply line in the non-display area for transmitting the reset control signal, and wherein the reset transmission lines include a reset power transmission line electrically connecting the reset power supply line and the reset power line, and a reset control transmission line electrically connecting the reset control supply line and the reset control line.

Two adjacent ones of the second dummy lines may be between, and may be respectively paired with, two of the data lines respectively overlapping two adjacent ones of the light-emitting pixel drivers, wherein the second dummy lines further include an offset line that is adjacent to the reset control transmission line for transmitting an offset signal having a polarity opposite to that of the reset control signal.

As described above, according to embodiments, the display area of the substrate includes the at least one sub-display area in which the emission areas and the light transmission areas are arranged.

Because light can reach a space under the substrate through the light transmission areas of the at least one sub-display area, an optical device under the substrate may be driven in a relatively normal way even if the optical device under the substrate overlaps the at least one sub-display area of the display area.

Therefore, because the display device according to embodiments does not include a hole overlapping an optical device, while still allowing the optical device to be driven by the at least one sub-display area, the display device may be adapted to an electronic device including the optical device.

The display device according to embodiments includes the reset transmission lines implemented by some of the second dummy lines. Accordingly, because the reset transmission lines are not provided, the ratio of the area in which the light-emitting pixel drivers are located in the display area may increase. In addition, because the reset transmission lines are part of the second dummy lines, the visibility of the reset transmission lines may be lowered.

The effects of the present disclosure are not limited to the aforementioned aspects, and various other aspects are included in the present specification.

BRIEF DESCRIPTION OF THE DRAWINGS

The above and other aspects of the present disclosure will become more apparent by describing in detail exemplary embodiments thereof with reference to the attached drawings, in which:

FIG. 8 is a cross-sectional view illustrating one light-emitting element, and the first transistor, the second transistor, the fourth transistor, and the sixth transistor of FIG. 7;

FIG. 9 is a layout diagram illustrating part C of FIG. 3;

FIG. 12 is a layout diagram illustrating part D of FIG. 3;

FIG. 13 is a cross-sectional view taken along the line H-H' of FIG. 12;

DETAILED DESCRIPTION

Figure 1:
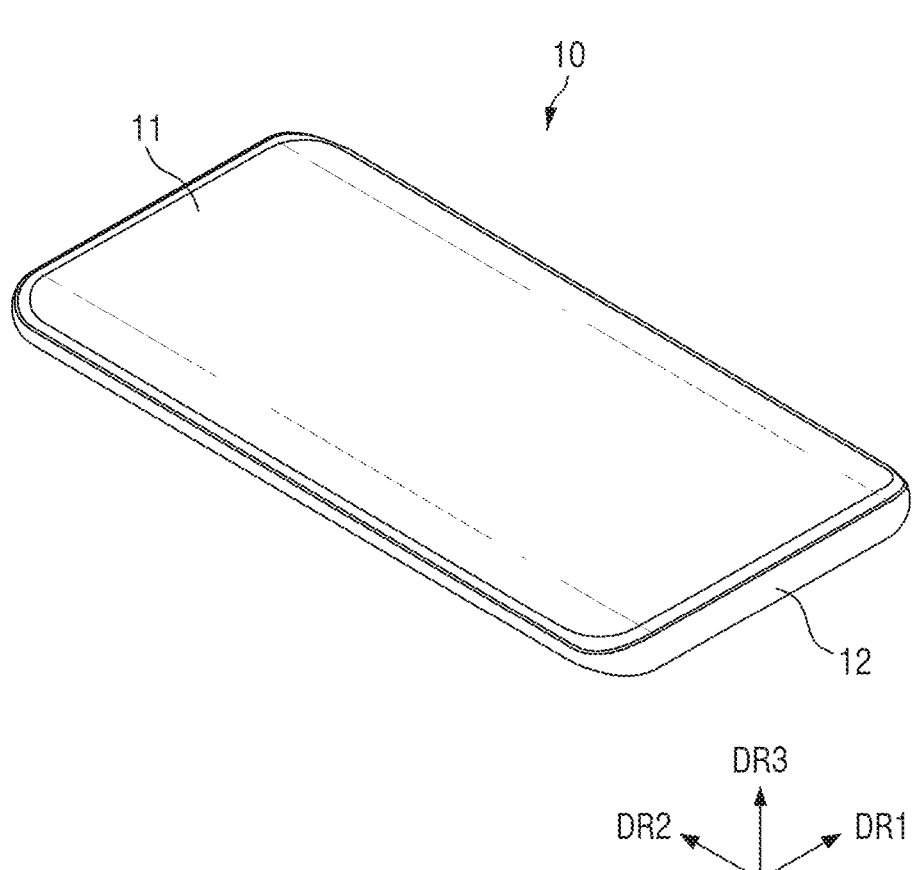
FIG. 1 is a perspective view showing an electronic device according to embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined or combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
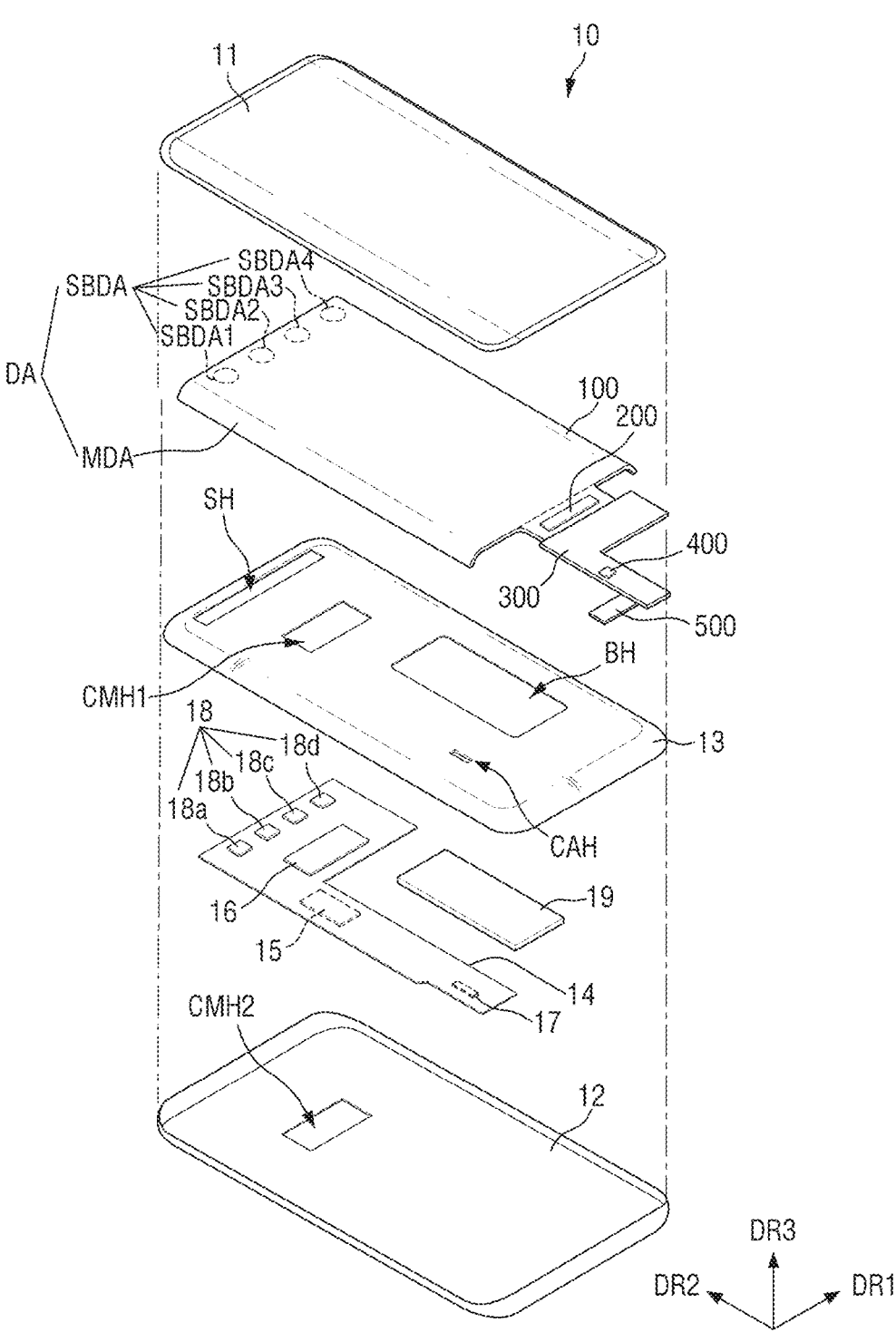
FIG. 2 is an exploded perspective view showing the electronic device of FIG. 1.

FIG. 1 is a perspective view showing an electronic device according to embodiments. FIG. 2 is an exploded perspective view showing the electronic device of FIG. 1.

Referring to FIG. 1, an electronic device 10 according to embodiments is a device having a function of displaying an image in a display area. The electronic device 10 may provide portability. For example, the electronic device 10 may be a portable electronic device, such as a mobile phone, a smartphone, a tablet personal computer (PC), a smart watch, a watch phone, a mobile communication terminal, an electronic notebook, an electronic book, a portable multimedia player (PMP), a navigation device and an ultramobile PC (UMPC).

However, the electronic device 10 according to embodiments is not limited to a portable electronic device, and may be a large-sized device, such as a television, a laptop computer, a monitor, a billboard, and an Internet-of-Things (IoT) device.

The electronic device 10 may include a cover window 11 and a lower cover 12 provided as a housing for protecting a display device 100 (see FIG. 2).

Referring to FIG. 2, the electronic device 10 according to embodiments may further include the display device 100, a bracket 13, at least one optical device 18, and a main circuit board 14 accommodated between the cover window 11 and the lower cover 12.

Hereinafter, the first direction DR1 may be a direction parallel to the short side of the electronic device 10 in plan view, that is, may be a widthwise direction of the electronic device 10. The second direction DR2 may be a direction parallel to the long side of the electronic device 10 in plan view, that is, may be a lengthwise direction of the electronic device 10. The third direction DR3 may be a thickness direction of the electronic device 10.

The electronic device 10 may have a rectangular shape in plan view. For example, the electronic device 10 may have a rectangular shape, in plan view, having a short side in the first direction DR1 and a long side in the second direction DR2. A corner where the short side in the first direction DR1 and the long side in the second direction DR2 meet may be right-angled or rounded with a curvature (e.g., a predetermined curvature). The planar shape of the electronic device 10 is not limited to the rectangular shape, and may be formed in another polygonal shape, a circular shape, or an elliptical shape.

The electronic device 10 may include a display surface on which a display area DA where an image display is implemented is located.

The display device 100 may include the display area DA that emits light to the display surface of the electronic device 10, and a non-display area NDA located around the display area DA. In addition, the display device 100 may further include a sub-region SBA (see FIG. 3) protruding from a portion of the non-display area NDA adjacent to one short side edge of the display area DA.

The display device 100 may further include a display driving circuit 200 placed in the sub-region SBA, a display circuit board 300 fastened to the edge of the sub-region SBA, a touch driving circuit 400 mounted on the display circuit board 300, and a cable 500 extending from one side of the display circuit board 300.

The display area DA may include a main display area MDA located in most of the display area DA, and at least one sub-display area SBDA surrounded by the main display area MDA and overlapping at least one optical device 18.

The cover window 11 may be located on the display device 100. Accordingly, one surface of the display device 100 through which light is emitted may be covered with the cover window 11. In other words, the cover window 11 may serve to protect the top surface of the display device 100.

The cover window 11 may include a transparent light-transmitting portion and an opaque light-blocking portion. The light-transmitting portion may overlap the display area DA of the display device 100 in the third direction DR3, and the light-blocking portion may overlap the non-display area NDA of the display device 100 in the third direction DR3.

The cover window 11 may include a top surface portion forming the top surface of the electronic device 10, a left side portion forming the left side surface of the electronic device 10, and a right side portion forming the right side surface of the electronic device 10. The left side portion of the cover window 11 may extend from the left side of the top surface portion, and the right side portion may extend from the right side of the top surface portion.

Each of the top surface portion, the left side portion, and the right side portion of the cover window 11 may include a light-transmitting portion and a light-blocking portion.

The light-transmitting portion of the cover window 11 may be located in most of the top surface portion, the left side portion, and the right side portion of the cover window 11.

The light-blocking portion of the cover window 11 may be located at the upper and lower edges of the top surface portion of the cover window 11, the upper, left, and lower edges of the left side portion of the cover window 11, and the upper, right, and lower edges of the right side portion of the cover window 11.

The bracket 13 may be located under the display device 100. The bracket 13 may include plastic, metal, or both plastic and metal. The bracket 13 may include a first camera hole CMH1 into which a camera device 16 is inserted, a battery hole BH for holding a battery 19, a light transmission hole SH into which the at least one optical device 18 is inserted, and a cable hole CAH serving as a passage of the cable 500 connected to the display circuit board 300.

The main circuit board 14 and the battery 19 may be located under the bracket 13. The main circuit board 14 may be a printed circuit board or a flexible printed circuit board.

A main processor 15, the camera device 16, a main connector 17, and the at least one optical device 18 may be mounted on the main circuit board 14.

The camera device 16 may be located on both the top surface and the bottom surface of the main circuit board 14, the main processor 15 may be located on the top surface of the main circuit board 14, and the main connector 17 may be located on the bottom surface of the main circuit board 14.

The main processor 15 may control all functions of the electronic device 10.

For example, the main processor 15 may output digital video data to the display driving circuit 200 through the display circuit board 300 such that the display device 100 displays an image. In addition, the main processor 15 may receive touch data including the user's touch coordinates from the touch driving circuit 400, determine whether the user's touch has been made or whether it is approaching, and then perform an operation corresponding to the user's touch input or approach input. For example, the main processor 15 may execute an application indicated by an icon touched by a user, or may perform an operation indicated thereby.

The main processor 15 may be an application processor formed of an integrated circuit, a central processing unit, or a system chip.

The camera device 16 may process an image frame of a still image or video obtained by an image sensor in a camera mode, and may output it to the main processor 15.

A cable 600 having passed through the cable hole CAH of the bracket 13 may be connected to the main connector 17. Thus, the main circuit board 14 may be electrically connected to the display circuit board 300.

The at least one optical device 18 may include a proximity sensor 18a, an illuminance sensor 18b, an iris sensor 18c, and a second camera sensor 18d.

The proximity sensor 18a, the illuminance sensor 18b, the iris sensor 18c, and the second camera sensor 18d may be located on the top surface of the main circuit board 14, and may be located in the light transmission hole SH of the bracket 13.

The proximity sensor 18a is a sensor for detecting an object approaching the front surface of the electronic device 10. The proximity sensor 18a may include a light source that outputs light, and a light receiver that receives light reflected by an object. The proximity sensor 18a may generate a sensing signal corresponding to the amount of light reflected by the object. Presence or absence of an object near the front surface of the electronic device 10 may be determined based on the sensing signal of the proximity sensor 18a.

The illuminance sensor 18b is a sensor for detecting the brightness of the front surface of the electronic device 10. The illuminance sensor 18b may include a resistor whose resistance value changes according to the brightness of the incident light.

The iris sensor 18c is a sensor for imaging the user's iris. It can be verified whether the user is a pre-registered user based on whether the image captured by the iris sensor 18c is the same as an iris image previously stored in a memory.

The second camera sensor 18d may process an image frame of a still image or video obtained by the image sensor, and may output the image or video to the main processor 710. The second camera sensor 18d may be a complementary metal-oxide-semiconductor (CMOS) image sensor or a charge-coupled device (CCD) sensor. The number of pixels of the second camera sensor 18d may be smaller than the number of pixels of a first camera sensor 720, and the size of the second camera sensor 18d may be smaller than the size of the first camera sensor 720.

The battery 19 may be spaced apart from the main circuit board 14. That is, the battery 19 may not overlap the main circuit board 14 in the third direction DR3. The battery 19 may be located in the battery hole BH of the bracket 13 in the third direction DR3.

In addition, the main circuit board 14 may be further equipped with a mobile communication module capable of transmitting and receiving radio signals with at least one of a base station, an external terminal, or a server in a mobile communication network. The radio signal may include various types of data according to transmission and reception of a voice signal, a video call signal, or a text/multimedia message.

The lower cover 12 may be located below the main circuit board 14 and the battery 19. The lower cover 12 may be fixed by being fastened to the bracket 13. The lower cover 12 may form the upper side surface, the lower side surface, and the bottom surface of the electronic device 10. The lower cover 12 may include plastic, metal, or both plastic and metal.

The lower cover 12 may include a second camera hole CMH2 through which the bottom surface of the camera device 16 is exposed.

However, the locations of the light transmission hole SH, the first camera hole CMH1, and the second camera hole CMH2 are not limited to those shown in FIG. 2.

Figure 3:
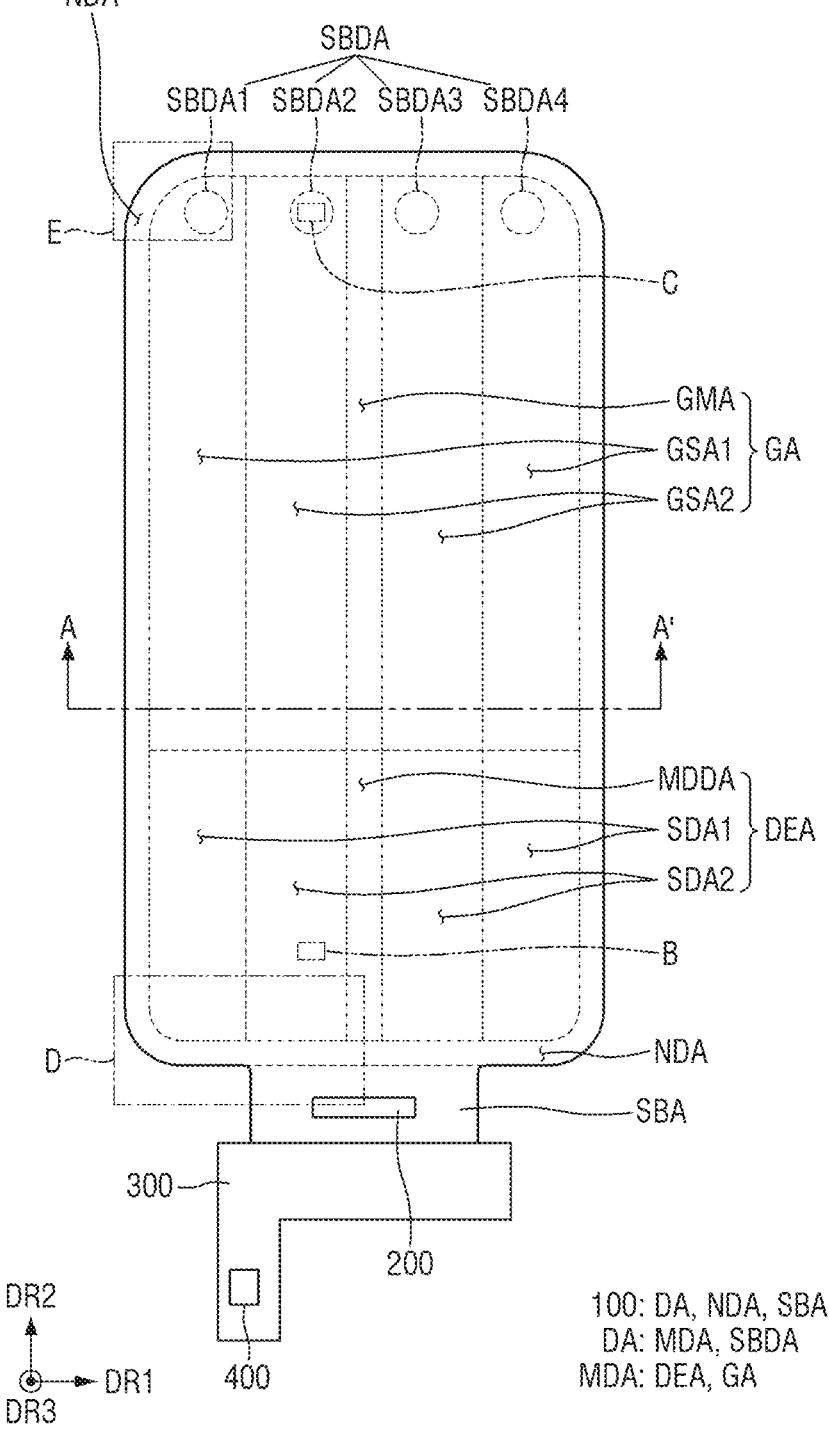
FIG. 3 is a plan view illustrating the display device of FIG. 2.

FIG. 3 is a plan view illustrating the display device of FIG. 2.

The display device 100 may include the display area DA and the non-display area NDA located on the display surface, and the sub-region SBA protruding from one side of the non-display area NDA.

The display area DA may be located on most of the display surface. The display area DA may be located at the center of the display surface.

The display area DA may include the main display area MDA located in most of the display area DA, and the at least one sub-display area SBDA surrounded by the main display area MDA (e.g., in plan view).

The at least one sub-display area SBDA may overlap the at least one optical device 18 (see FIG. 2).

Meanwhile, the display area DA may include a bypass area DEA located on one side adjacent to the sub-region SBA, and a general area GA located in the remaining area other than the bypass area DEA.

The bypass area DEA includes a bypass middle area MDDA located at the center in the first direction DR1, a first bypass side area SDA1 parallel to the bypass middle area MDDA, spaced apart therefrom in the first direction DR1, and in contact with the non-display area NDA, and a second bypass side area SDA2 located between the bypass middle area MDDA and the first bypass side area SDA1.

The first bypass side area SDA1 may be closer to the bent edge of a substrate 110 than the bypass middle area MDDA and the second bypass side area SDA2.

The first bypass side area SDA1 and the second bypass side area SDA2 may be located between the bypass middle area MDDA and the non-display area NDA on both sides of the bypass middle area MDDA with respect to the first direction DR1.

The general area GA may include a general middle area GMA connected to the bypass middle area MDDA of the bypass area DEA in the second direction DR2, a first general side area GSA1 connected to the first side area SDA1 of the bypass area DEA in the second direction DR2, and a second general side area GSA2 connected to the second side area SDA2 of the bypass area DEA in the second direction DR2.

The non-display area NDA may be located outside the display area DA. The non-display area NDA may be an edge area of the display surface.

The sub-region SBA may protrude in the second direction DR2 from a portion of the non-display area NDA adjacent to the short side of the display area DA. Because a portion of the sub-region SBA may be transformed in a bent shape, another portion of the sub-region SBA may overlap the display area DA and the non-display area NDA in the third direction DR3.

The display device 100 may include a top surface portion facing the top surface portion of the cover window 11, a left side portion facing the left side portion of the cover window 11, and a right side portion facing the right side portion of the cover window 11. The left side portion of the display device 100 may extend from the left side of the top surface portion, and the right side portion thereof may extend from the right side of the top surface portion. Each of the top surface portion, the left side portion, and the right side portion of the display device 100 may include the display area DA and the non-display area NDA.

The display area DA may be located in most of each of the top surface portion, the left side portion, and the right side portion of the display device 100.

The non-display area NDA may be located at the upper and lower edges of the top surface portion of the display device 100, the upper, left and lower edges of the left side portion of the display device 100, and the upper, right, and lower edges of the right side portion of the display device 100.

The display driving circuit 200 may be mounted on the sub-region SBA of the display device 100, and the display circuit board 300 may be attached thereto.

One end of the display circuit board 300 may be attached to pads located at the lower edge of the sub-region SBA of the display device 100 by using an anisotropic conductive film.

The display circuit board 300 may be a flexible printed circuit board (FPCB) that is bendable, a rigid printed circuit board (PCB) that maintains a flat shape, or a composite printed circuit board having both of the rigid printed circuit board and the flexible printed circuit board.

The display driving circuit 200 may output a data signal Vdata (see FIGS. 7 and 11) based on control signals and power voltages supplied from the display circuit board 300.

The display driving circuit 200 may be provided as an integrated circuit (IC), and may be mounted on the sub-region SBA of the display device 100 by a chip on glass (COG) method, a chip on plastic (COP) method, or an ultrasonic method. However, this is only an example, and one or more embodiments is not limited thereto. For example, the display driving circuit 200 may be mounted on the display circuit board 300.

According to one or more embodiments, the touch driving circuit 400 may be further mounted on the sub-region SBA of the display device 100. Alternatively, as shown in FIG. 2, the touch driving circuit 400 may be mounted on the display circuit board 300. The touch driving circuit 400 may be electrically connected to a touch sensor layer 150 (see FIG. 4) of the display device 100.

The touch driving circuit 400 may determine whether the user has touched the display device 100 and/or whether the user has approached the display device 100 by applying touch driving signals to driving lines of the touch sensor layer 150, and by detecting charge changes of capacitances based on touch sensing signals received from sensing lines. The user's touch means that an object, such as the user's finger or a pen, comes into direct contact with the top surface of the cover window 11 located on the touch sensor layer. The user's approach means that the object, such as the user's finger or the pen, hovers over the top surface of the cover window 11. The touch driving circuit 400 may output touch data including the touch coordinates of the user to the main processor 15.

Figure 4:
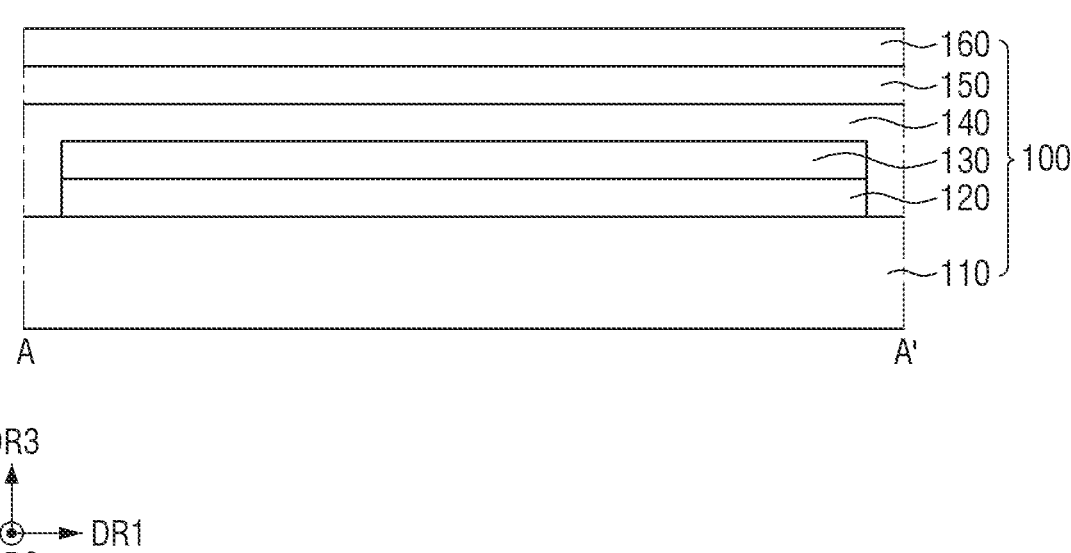
FIG. 4 is a cross-sectional view taken along the line A-A' of FIG. 3.

FIG. 4 is a cross-sectional view taken along the line A-A' of FIG. 3.

Referring to FIG. 4, the display device 100 according to embodiments may include the substrate 110, a circuit layer 120 located on the substrate 110, and an element layer 130 located on the circuit layer 120.

In addition, the display device 100 according to embodiments may further include an encapsulation layer 140 covering the element layer 130, the touch sensor layer 150 located on the encapsulation layer 140, and a polarization layer 160 located on the touch sensor layer 150.

The substrate 110 may be formed of an insulating material, such as a polymer resin. For example, the substrate 110 may be formed of polyimide. The substrate 110 may be a flexible substrate which can be bent, folded or rolled. Alternatively, the substrate 110 may be formed of an insulating material, such as glass or the like. The substrate 110 may include the display area DA, the non-display area NDA, and the sub-region SBA.

The element layer 130 may include light-emitting elements LE (see FIG. 6) respectively located in the emission areas EA (see FIGS. 5 and 9) of the display area DA.

The circuit layer 120 may include light-emitting pixel drivers EPD (see FIG. 7) or EPD' (see FIG. 11) electrically connected to the light-emitting elements LE of the element layer 130, respectively.

The encapsulation layer 140 may cover the element layer 130 and may extend into the non-display area NDA to be contact with the circuit layer 120. The encapsulation layer 140 may include a structure in which two or more inorganic layers and at least one organic layer are alternately stacked.

The touch sensor layer 150 may be located on the encapsulation layer 140 and may correspond to the main region MA. The touch sensor layer 150 may include touch electrodes for sensing a touch of a person or an object.

The polarization layer 160 blocks external light reflected from the touch sensor layer 150, the encapsulation layer 140, the element layer 130, and the circuit layer 120, and the interfaces thereof, to thereby reduce or prevent deterioration of visibility of an image due to external light reflection.

The cover window 11 of the electronic device 10 may be located on the polarization layer 160. The cover window 11 may be attached to the polarization layer 160 by a transparent adhesive member, such as an optically clear adhesive (OCA) film or an optically clear resin (OCR).

The cover window 11 may be made of an inorganic material, such as glass, or an organic material, such as plastic or a polymer material.

Due to the cover window 11, the touch sensor layer 150, the encapsulation layer 140, the element layer 130, and the circuit layer 120 may be protected from electrical and physical impact on the display surface.

Figure 5:
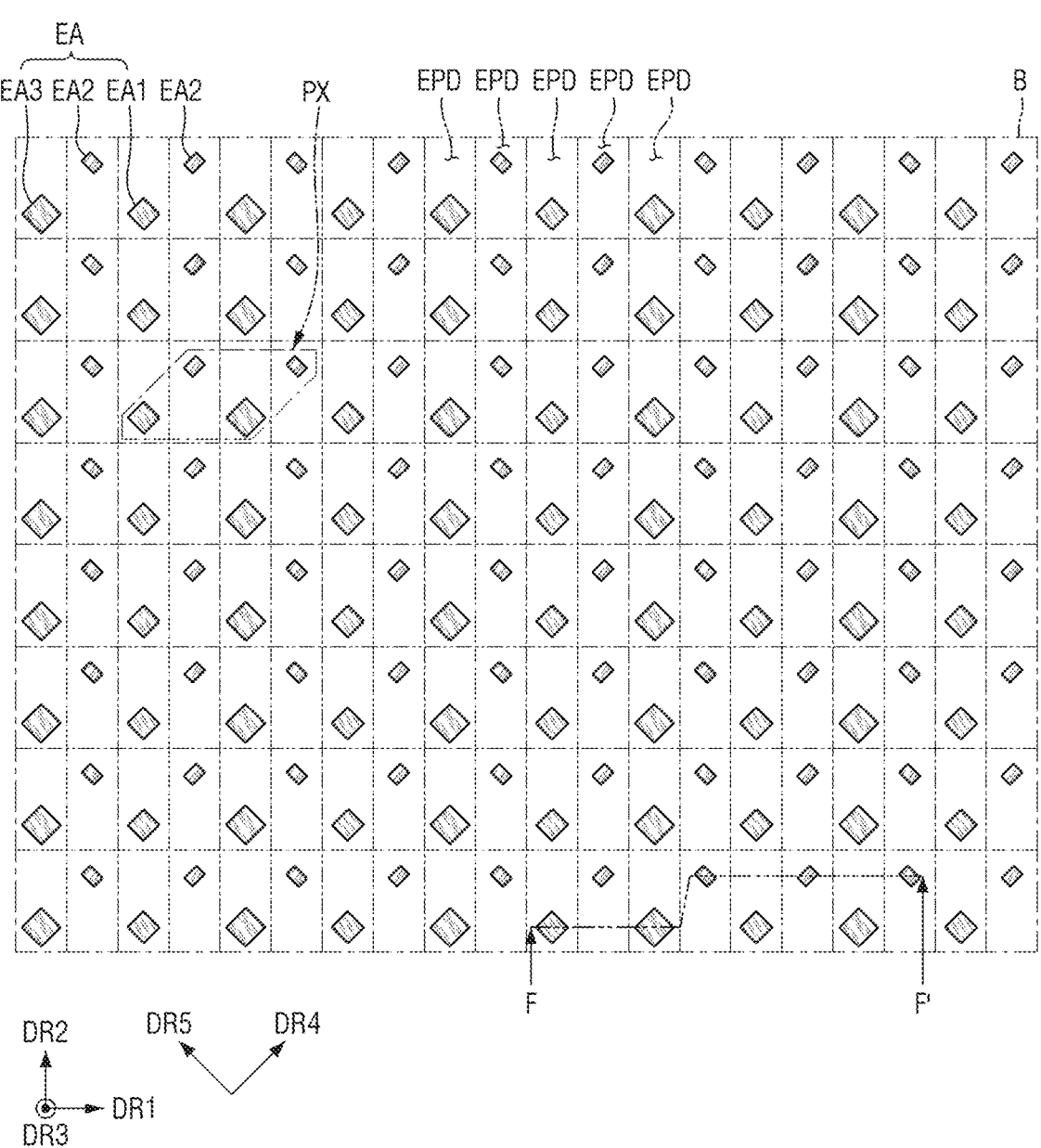
FIG. 5 is a layout diagram illustrating part B of FIG. 3.
Figure 6:
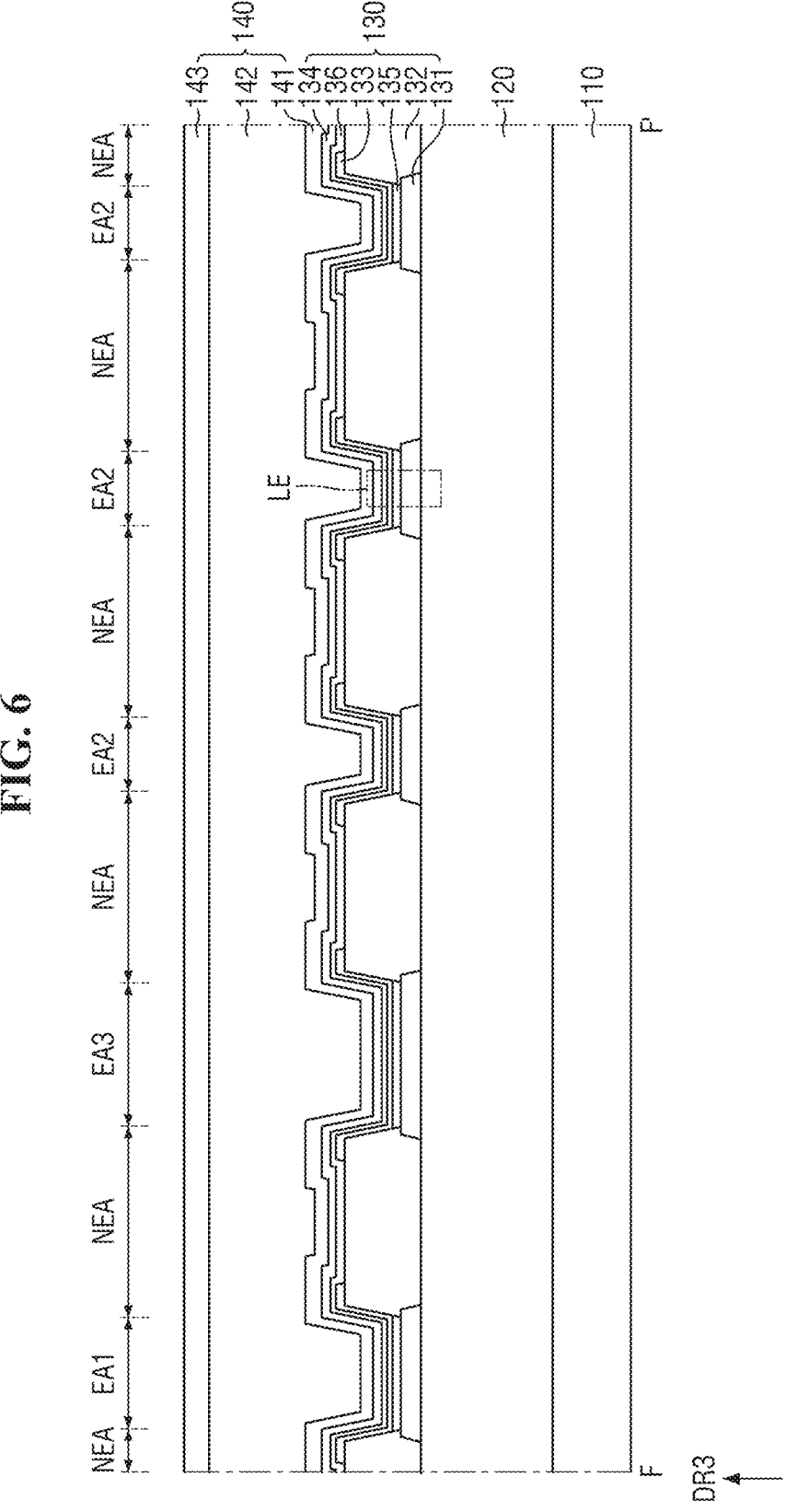
FIG. 6 is a cross-sectional view taken along the line F-F' of FIG. 5.

FIG. 5 is a layout diagram illustrating part B of FIG. 3. FIG. 6 is a cross-sectional view taken along the line F-F' of FIG. 5.

The display area DA of the display device 100 according to embodiments may include the emission areas EA. In addition, the display area DA may further include non-emission areas NEA (see FIG. 6) located in gaps between the emission areas EA.

Referring to FIGS. 5 and 6, in the main display area MDA located in most of the display area DA, the emission areas EA may be arranged side by side.

The emission areas EA may have a rhombus planar shape or a rectangular planar shape. However, this is only an example, and the planar shape of the emission areas EA according to one or more embodiments is not limited to that illustrated in FIG. 5. That is, in plan view, the emission areas EA may have a polygonal shape, such as a square, a pentagon, a hexagon, etc., or may have a circular or elliptical shape including the edge of a curve.

The emission areas EA may include first emission areas EA1 for emitting light of a first color in a wavelength band (e.g., a predetermined wavelength band), second emission areas EA2 for emitting light of a second color in a wavelength band lower than that of the first color, and third emission areas EA3 for emitting light of a third color in a wavelength band lower than that of the second color.

For example, the first color may be red having a wavelength band of about 600 nm to about 750 nm. The second color may be green having a wavelength band of about 480 nm to about 560 nm. The third color may be blue having a wavelength band of about 370 nm to about 460 nm.

The first emission areas EA1 and the third emission areas EA3 may be alternately arranged in at least one of the first direction DR1 and the second direction DR2.

The second emission areas EA2 may be arranged side by side in at least one of the first direction DR1 and the second direction DR2.

In addition, the second emission areas EA2 may be adjacent to the first emission areas EA1 and the third emission areas EA3 in diagonal directions DR4 and DR5, each of which crossing the first direction DR1 and the second direction DR2.

Pixels PX displaying their own luminances and colors may be provided by the first emission area EA1, the second emission area EA2, and the third emission area EA3 adjacent to each other among these emission areas EA.

In other words, the pixels PX may be a basic unit for displaying various colors including white with a luminance (e.g., a predetermined luminance).

Each of the pixels PX may include at least one first emission area EA1, at least one second emission area EA2, and at least one third emission area EA3 that are adjacent to each other. Accordingly, each of the pixels PX may display various colors through a mixture of the light emitted from the first emission area EA1, the second emission area EA2, and the third emission area EA3 that are adjacent to each other.

As shown in FIG. 6, the element layer 130 may include the light-emitting elements LE respectively located in the emission areas EA, respectively.

The light-emitting element LE may be an organic light-emitting diode having a light-emitting layer made of an organic light-emitting material. Alternatively, the light-emitting element LE may be an inorganic light-emitting element including a light-emitting layer made of an inorganic semiconductor. Alternatively, the light-emitting element LE may be a quantum dot light-emitting element having a quantum dot light-emitting layer. Alternatively, the light-emitting element LE may be a micro light-emitting diode.

Each of the light-emitting elements LE may include an anode electrode 131 and a cathode electrode 134 facing each other, and a light-emitting layer 133 located therebetween.

That is, the element layer 130 may include the anode electrodes 131 respectively corresponding to the emission areas EA, a pixel-defining layer 132 corresponding to the non-emission area NEA and covering the edge of the anode electrode 131, and the cathode electrode 134 located on the light-emitting layers 133 and the pixel-defining layer 132.

Alternatively, each of the light-emitting elements LE may further include a first common layer 135 located between the anode electrode 131 and the light-emitting layer 133, and a second common layer 136 located between the light-emitting layer 133 and the cathode electrode 134.

The anode electrode 131 may be located in each of the emission areas EA. The anode electrodes 131 of the emission areas EA may be electrically connected to the light-emitting pixel drivers EPD and EPD' of the circuit layer 120, respectively. This anode electrode 131 may be referred to as a pixel electrode.

The pixel-defining layer 132 may be located in the non-emission area NEA, and may cover the edge of the anode electrode 131.

The light-emitting layer 133 may be located on the anode electrode 131. The light-emitting layer 133 may be formed of an organic light-emitting material that converts electron-hole pairs into light.

The cathode electrode 134 may be located on the light-emitting layers 133 of the emission areas EA and the pixel-defining layer 132. That is, the cathode electrode 134 may be located across the emission areas EA and the non-emission area NEA. The cathode electrode 134 may be referred to as a common electrode.

The encapsulation layer 140 may be located on the circuit layer 120, and may cover the element layer 130. The encapsulation layer 140 may include a first encapsulation layer 141 located on the element layer 130 and made of an inorganic insulating material, a second encapsulation layer 142 located on the first encapsulation layer 141, overlapping the element layer 130, and made of an organic insulating material, and a third encapsulation layer 143 located on the first encapsulation layer 141, covering the second encapsulation layer 142, and made of an inorganic insulating material.

Figure 7:
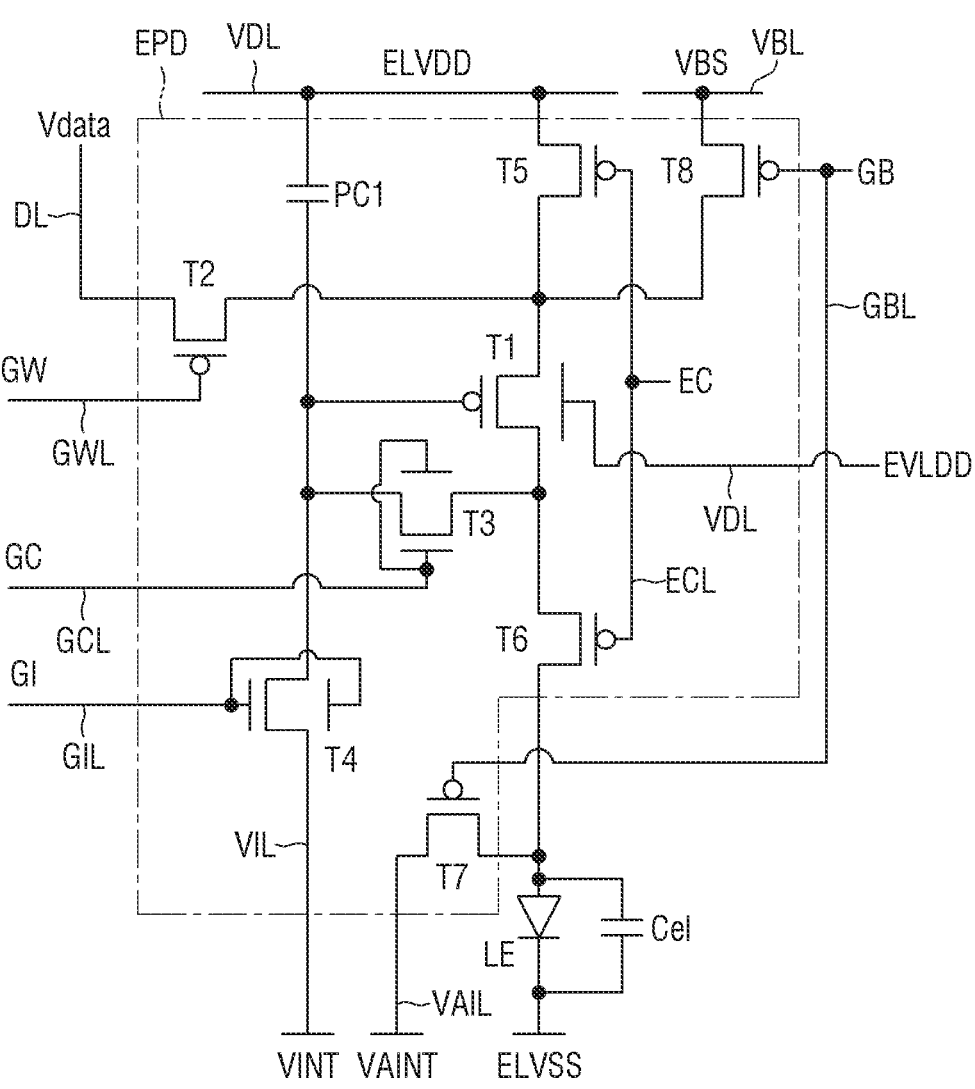
FIG. 7 is an equivalent circuit diagram of a main light-emitting pixel driver electrically connected to one light-emitting element located in one of the emission areas arranged in the main display area.

FIG. 7 is an equivalent circuit diagram of a main light-emitting pixel driver electrically connected to one light-emitting element located in one of the emission areas arranged in the main display area.

Referring to FIG. 7, the light-emitting pixel drivers EPD (EPD' of FIG. 11) of the circuit layer 120 are electrically connected to the light-emitting elements LE of the element layer 130, respectively.

That is, the anode electrode 131 of the light-emitting element LE is electrically connected to the light-emitting pixel driver EPD (EPD'), and the cathode electrode 134 of the light-emitting element LE may be applied with a second power ELVSS that is lower than a first power ELVDD.

A capacitor Cel shown in parallel with the light-emitting element LE refers to a parasitic capacitance between the anode electrode 131 and the cathode electrode 134.

The circuit layer 120 may further include a first power line VDL for transmitting the first power ELVDD, a first initialization power line VIL for transmitting a first initialization power VINT, a second initialization power line VAIL for transmitting a second initialization power VAINT, and a bias power line VBL for transmitting a bias power VBS.

In addition, the circuit layer 120 may further include a scan write line GWL for transmitting a scan write signal GW, a scan initialization line GIL for transmitting a scan initialization signal GI, a gate control line GCL for transmitting a gate control signal GC, and a bias control line GBL for transmitting a bias control signal GB.

Each of the light-emitting pixel drivers EPD (hereinafter referred to as "main light-emitting pixel driver EPD") electrically connected to the light-emitting elements LE located in the emission areas EA of the main display area MDA may include a first transistor T1 configured to generate a driving current for driving the light-emitting element LE, two or more transistors T2 to T8 electrically connected to the first transistor T1, and at least one capacitor PC1.

The first transistor T1 is connected in series with the light-emitting element LE between the first power line VDL and the second power line VSL. That is, the first electrode (e.g., the source electrode) of the first transistor T1 may be electrically connected to the first power line VDL through the fifth transistor T5. Further, the second electrode (e.g., the drain electrode) of the first transistor T1 may be electrically connected to the anode electrode 131 of the light-emitting element LE through the sixth transistor T6.

The first electrode of the first transistor T1 may be electrically connected to a data line DL through the second transistor T2.

The gate electrode of the first transistor T1 may be electrically connected to the first power line VDL through the first capacitor PC1. That is, the first capacitor PC1 may be electrically connected between the gate electrode of the first transistor T1 and the first power line VDL. Accordingly, the potential of the gate electrode of the first transistor T1 may be maintained by the first power ELVDD of the first power line VDL.

Accordingly, when the data signal Vdata of the data line DL is transmitted to the first electrode of the first transistor T1 through the turned-on second transistor T2, the voltage difference corresponding to the data signal Vdata and the first power ELVDD may be generated between the gate electrode of the first transistor T1 and the first electrode of the first transistor T1. At this time, when the voltage difference between the gate electrode of the first transistor T1 and the first electrode of the first transistor T1, that is, a gate-source voltage difference is above a threshold voltage, the first transistor T1 may be turned on to generate a drain-source current of the first transistor T1 corresponding to the data signal Vdata.

Then, when the fifth transistor T5 and the sixth transistor T6 are turned on, the first transistor T1 may be connected in series with the light-emitting element LE between the first power line VDL and the second power line VSL. Accordingly, the drain-source current of the first transistor T1 corresponding to the data signal Vdata may be supplied as a driving current of the light-emitting element LE. Accordingly, the light-emitting element LE may emit light having a luminance corresponding to the data signal Vdata.

The second transistor T2 may be connected between the first electrode of the first transistor T1 and the data line DL. The second transistor T3 may be turned on by the scan write signal GW of the scan write line GWL.

The third transistor T3 may be connected between the gate electrode of the first transistor T1 and the second electrode of the first transistor T1. The third transistor T3 may be turned on by the gate control signal GC of the gate control line GCL.

The fourth transistor T4 may be connected between the gate electrode of the first transistor T1 and the first initialization power line VIL. The fourth transistor T4 may be turned on by the scan initialization signal GI of the scan initialization line GIL Each of the third transistor T3 and the fourth transistor T4 may be implemented as an N-type MOSFET.

The fifth transistor T5 may be connected between the first electrode of the first transistor T1 and the first power line VDL.

The sixth transistor T6 may be connected between the second electrode of the first transistor T1 and the anode electrode of the light-emitting element LE.

The fifth transistor T5 and the sixth transistor T6 may be turned on by the emission control signal EC of the light emission control line ECL.

The seventh transistor T7 may be connected between the anode electrode of the light-emitting element LE and the second initialization power line VAIL. The seventh transistor T7 may be turned on by the bias control signal GB of the bias control line GBL.

The eighth transistor T8 may be connected between the first electrode of the first transistor T1 and the bias power line VBL. The eighth transistor T8 may be turned on by the bias control signal GB of the bias control line GBL.

Among the first to eighth transistors T1 to T8, each of the transistors T1, T2, and T5 to T8, not including the third transistor T3 and the fourth transistor T4, may be implemented as a P-type MOSFET.

Figure 8:
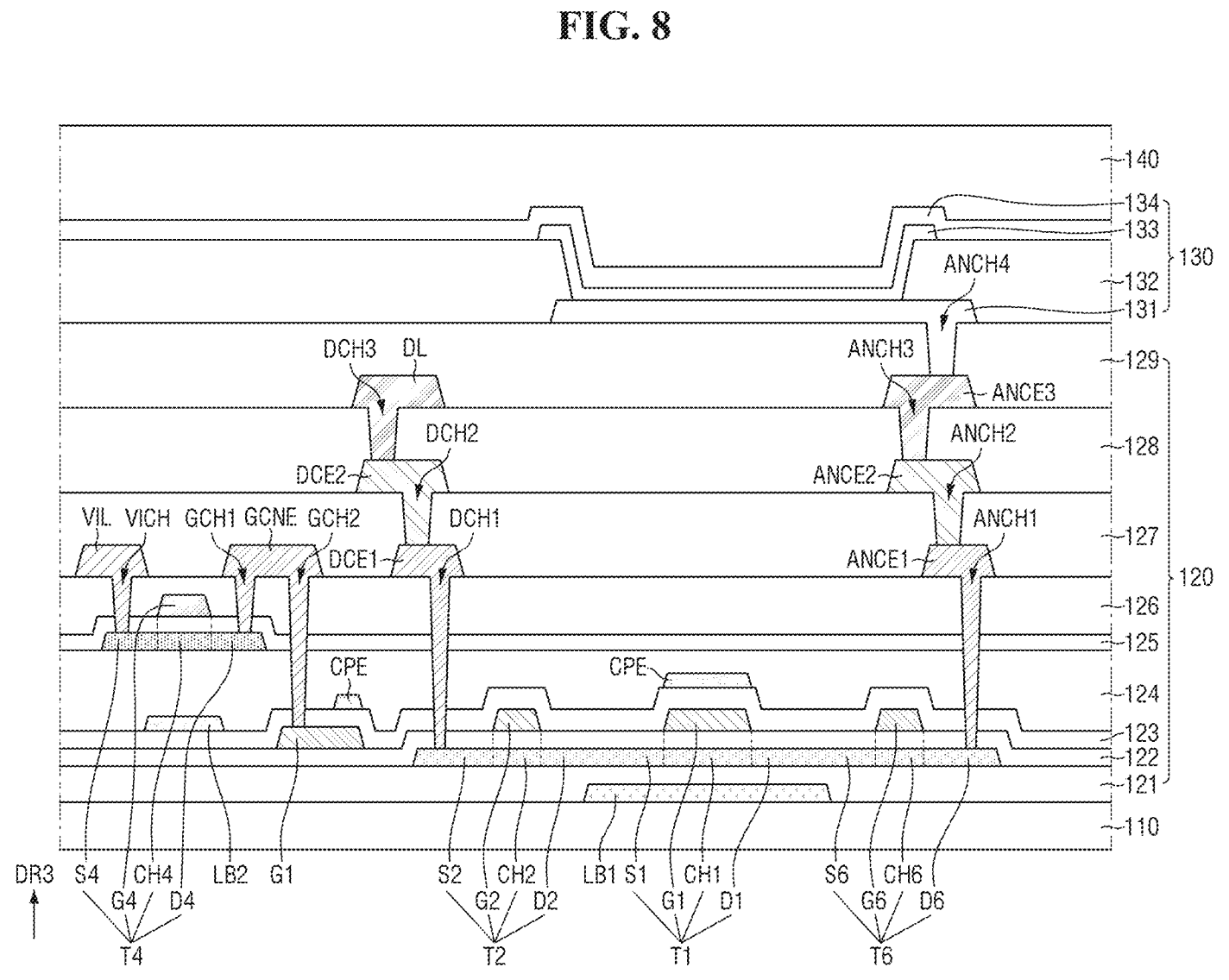

FIG. 8 is a cross-sectional view illustrating one light-emitting element, and the first transistor, the second transistor, the fourth transistor, and the sixth transistor of FIG. 7.

Referring to FIG. 8, the circuit layer 120 may include: a buffer layer 121 covering a first light-blocking layer LB1 on the substrate 110; a first semiconductor layer CH1, S1, D1, CH2, S2, D2, CH6, S6, and D6 located on the buffer layer 121; a first gate-insulating layer 122 covering the first semiconductor layer CH1, S1, D1, CH2, S2, D2, CH6, S6, and D6; a first gate conductive layer G1, G2, and G6 located on the first gate-insulating layer 122; a second gate-insulating layer 123 covering the first gate conductive layer G1, G2, and G6; a second gate conductive layer CPE and LB2 located on the second gate-insulating layer 123; a first interlayer insulating layer 124 covering the second gate conductive layer CPE and LB2; a second semiconductor layer CH4, S4, and D4 located on the first interlayer insulating layer 124; a third gate-insulating layer 125 covering the second semiconductor layers CH4, S4, and D4; a third gate conductive layer G4 located on the third gate-insulating layer 125; a second interlayer insulating layer 126 covering the third gate conductive layer G4; a first source-drain conductive layer ANCE1, DCE1, GCNE, and VIL located on the second interlayer insulating layer 126; a first planarization layer 127 covering the first source-drain conductive layer ANCE1, DCE1, GCNE, and VIL; a second source-drain conductive layer ANCE2 and DCE2 located on the first planarization layer 127; a second planarization layer 128 covering the second source-drain conductive layer ANCE2 and DCE2; and a third source-drain conductive layer ANCE3 and DL located on the second planarization layer 128.

The first transistor T1 may include the channel portion CH1, the source portion S1, and the drain portion D1 formed of the first semiconductor layer on the buffer layer 121, and the gate electrode G1 located on the first gate-insulating layer 122 and overlapping the channel portion CH1. The channel portion CH1 of the first transistor T1 may overlap the first light-blocking layer LB1 on the substrate 110.

The second transistor T2 may include the channel portion CH2, the source portion S2, and the drain portion D2 formed of the first semiconductor layer on the buffer layer 121, and the gate electrode G2 located on the first gate-insulating layer 122 and overlapping the channel portion CH2.

The sixth transistor T6 may include the channel portion CH6, the source portion S6, and the drain portion D6 formed of the first semiconductor layer on the buffer layer 121, and the gate electrode G6 located on the first gate-insulating layer 122 and overlapping the channel portion CH6.

The source portion S2 of the second transistor T2 may be electrically connected to the data line DL through the first data connection electrode DCE1 and the second data connection electrode DCE2.

The first data connection electrode DCE1 may be located on the second interlayer insulating layer 126, and may be electrically connected to the source portion S2 of the second transistor T2 through a first data connection hole DCH1 penetrating the second interlayer insulating layer 126, the third gate-insulating layer 125, the first interlayer insulating layer 124, the second gate-insulating layer 123, and the first gate-insulating layer 122.

The second data connection electrode DCE2 may be located on the first planarization layer 127, and may be electrically connected to the first data connection electrode DCE2 through a second data connection hole DCH2 penetrating the first planarization layer 127.

The data line DL may be located on the second planarization layer 128, and may be electrically connected to the second data connection electrode DCE2 through a third data connection hole DCH3 penetrating the second planarization layer 128.

The drain portion D2 of the second transistor T2 may be connected to the source portion S1 of the first transistor T1.

The drain portion D1 of the first transistor T1 may be connected to the source portion S6 of the sixth transistor T6.

The drain portion D6 of the sixth transistor T6 may be electrically connected to the anode electrode 131 through the first anode connection electrode ANCE1, the second anode connection electrode ANCE2, and the third anode connection electrode ANCE3.

The first anode connection electrode ANCE1 may be located on the second interlayer insulating layer 126 and electrically connected to the drain portion D6 of the sixth transistor T6 through the first anode connection hole ANCH1 penetrating the second interlayer insulating layer 126, the third gate-insulating layer 125, the first interlayer insulating layer 124, the second gate-insulating layer 123, and the first gate-insulating layer 122.

The second anode connection electrode ANCE2 may be located on the first planarization layer 127 and electrically connected to the first anode connection electrode ANCE1 through the second anode connection hole ANCH2 penetrating the first planarization layer 127.

The third anode connection electrode ANCE3 may be located on the second planarization layer 128, and may be electrically connected to the second anode connection electrode ANCE2 through the third anode connection hole ANCH3 penetrating the second planarization layer 128.

The anode electrode 131 may be located on the third planarization layer 129, and may be electrically connected to the third anode connection electrode ANCE3 through a fourth anode connection hole ANCH4 penetrating a third planarization layer 129.

The first capacitor PC1 may be provided by an overlapping region between the capacitor electrode CPE located on the second gate-insulating layer 123 and the gate electrode G1 of the first transistor T1.

The fourth transistor T4 may include the channel portion CH4, the source portion S4, and the drain portion D4 formed of the second semiconductor layer on the first interlayer insulating layer 124, and the gate electrode G4 located on the third gate-insulating layer 125 and overlapping the channel portion CH4.

The channel portion CH4 of the fourth transistor T4 may overlap the second light-blocking layer LB2 on the second gate-insulating layer 123.

The source portion S4 of the fourth transistor T4 may be electrically connected to the first initialization power line VIL on the second interlayer insulating layer 126 through a hole VICH penetrating the second interlayer insulating layer 126 and the third gate-insulating layer 125.

The drain portion D4 of the fourth transistor T4 may be electrically connected to the gate electrode G1 of the first transistor T1 through the gate connection electrode GCNE on the second interlayer insulating layer 126.

The gate connection electrode GCNE may be electrically connected to the drain portion D4 of the fourth transistor T4 through the first gate connection hole GCH1 penetrating the second interlayer insulating layer 126 and the third gate-insulating layer 125.

The gate connection electrode GCNE may be electrically connected to the gate electrode G1 of the first transistor T1 through the second gate connection hole GCH2 penetrating the second interlayer insulating layer 126, the third gate-insulating layer 125, the first interlayer insulating layer 124, and the second gate-insulating layer 123.

Meanwhile, because the third transistor T3 has a structure similar to that of the fourth transistor T4, and the fifth transistor T5 and the seventh transistor T7 have structures similar to those of the second transistor T2 and the sixth transistor T6, redundant description will be omitted below.

Figure 9:
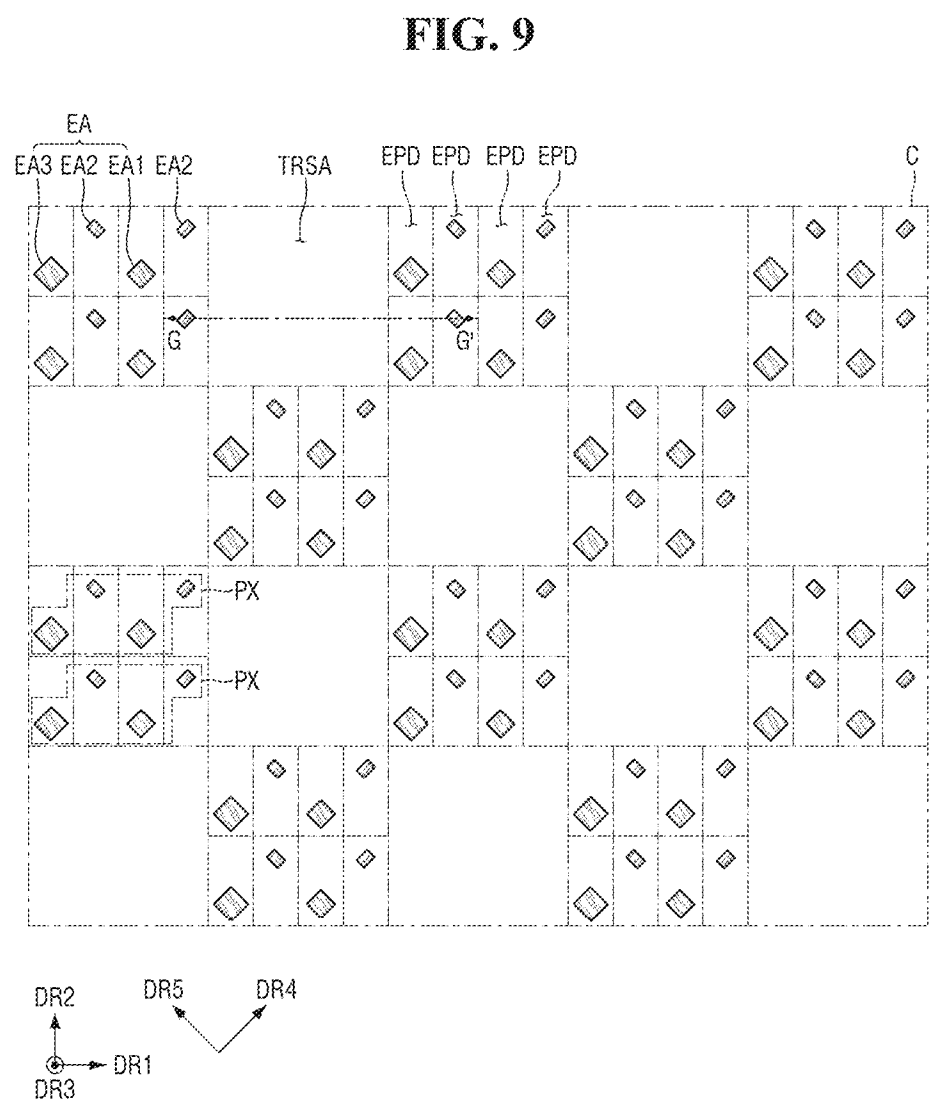
Figure 10:
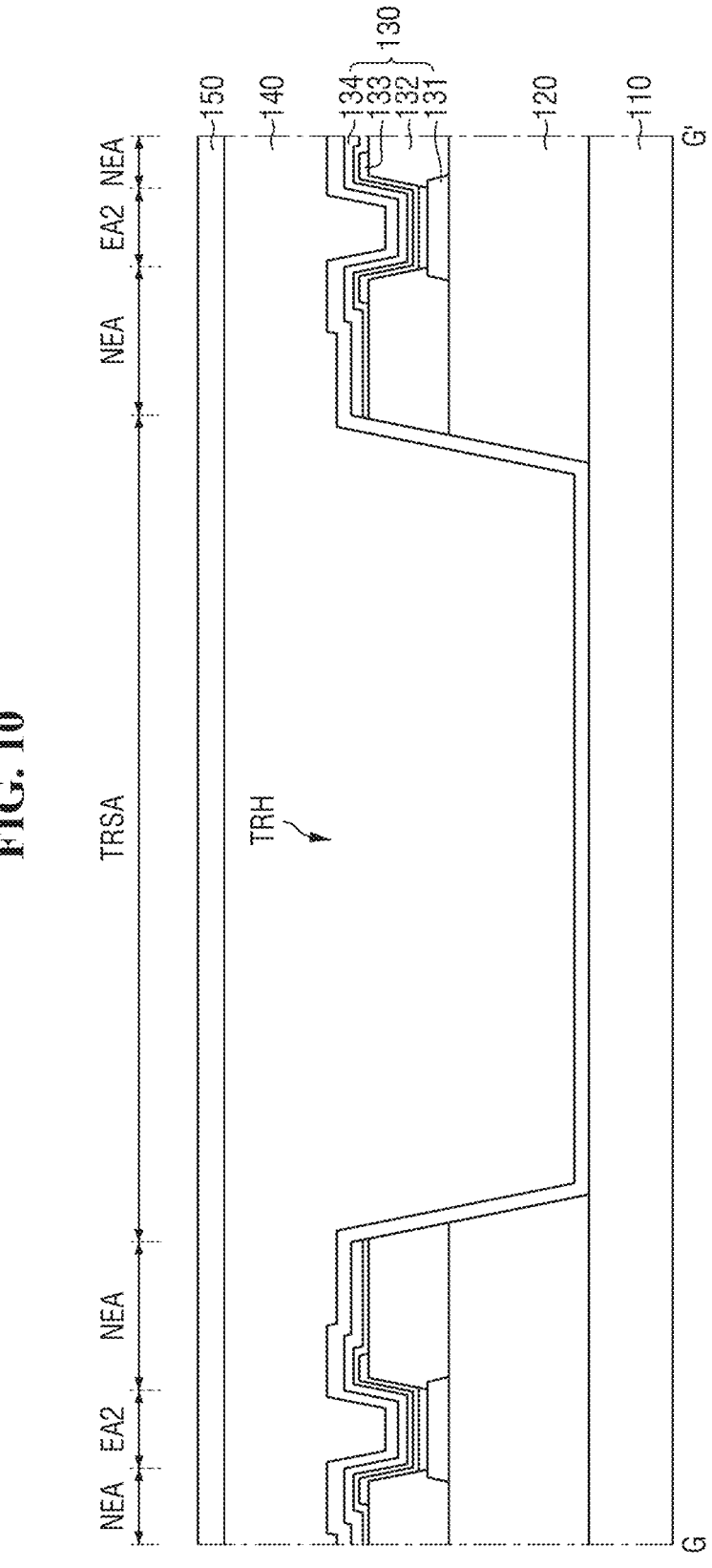
FIG. 10 is a cross-sectional view taken along the line G-G' of FIG. 9.

FIG. 9 is a layout diagram illustrating part C of FIG. 3. FIG. 10 is a cross-sectional view taken along the line G-G' of FIG. 9.

The display area DA of the display device 100 according to embodiments may include not only the main display area MDA, but also the at least one sub-display area SBDA overlapping the optical devices 18.

Referring to FIG. 9, the at least one sub-display area SBDA according to embodiments may further include light transmission areas TRSA located between the emission areas EA.

That is, the at least one sub-display area SBDA may include the emission areas EA for image display, and the light transmission areas TRSA that transmit the light of the optical devices 18.

That is, the at least one optical device 18 located under the substrate 110 may overlap the at least one sub-display area SBDA including the light transmission areas TRSA, and the light of the optical device 18 can pass through the display device 100 through the light transmission areas TRSA. Accordingly, even if the display device 100 according to embodiments does not have a hole for the arrangement of the optical device 18, the function of the optical device 18 may be implemented relatively normally.

Therefore, a decrease of the ratio of the display area DA in the display device 100 that might be caused by the arrangement of the optical device 18 may be avoided, so that the display quality and aesthetics of the display device 100 may be improved.

Each of the light transmission areas TRSA may be adjacent to at least one pixel PX both in the first direction DR1 and the second direction DR2.

The width of the light transmission area TRSA in the first direction DR1 may be similar to the width of the pixel PX in the first direction DR1, and the width of the light transmission area TRSA in the second direction DR2 may be a multiple of the width of the pixel PX in the first direction DR1.

In this case, the light transmission areas TRSA may be alternately arranged with two or more pixels PX in the second direction DR2. In addition, the light transmission areas TRSA may be alternately located with at least one pixel PX in the first direction DR1.

To improve the light transmission of the light transmission area TRSA, the light-emitting pixels LE and the light-emitting pixel drivers EPD electrically connected to them do not overlap the light transmission area TRSA.

Referring to FIG. 10, the display device 100 according to embodiments may further include a light transmission hole TRH overlapping the light transmission area TRSA. To reduce light loss, the light transmission hole TRH may penetrate the element layer 130 and the circuit layer 120. In this case, the first encapsulation layer 141 of the encapsulation layer 140 may be in contact with the substrate 110 through the light transmission hole TRH.

Figure 11:
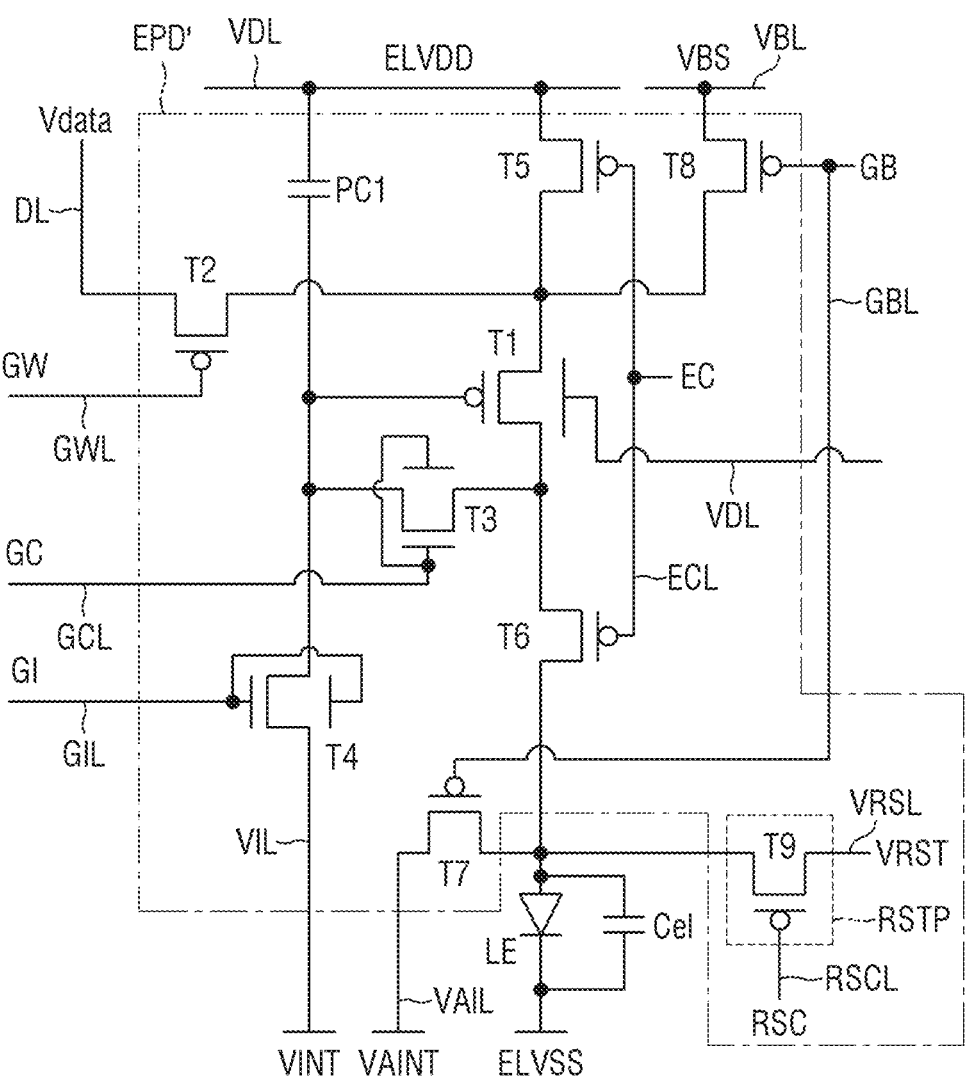
FIG. 11 is an equivalent circuit diagram of a sub-light-emitting pixel driver electrically connected to one light-emitting element located in one of the emission areas arranged in the at least one sub-display area.

FIG. 11 is an equivalent circuit diagram of a sub-light-emitting pixel driver electrically connected to one light-emitting element located in one of the emission areas arranged in the at least one sub-display area.

Referring to FIG. 11, each of the light-emitting pixel drivers EPD' (hereinafter referred to as "sub-light-emitting pixel drivers EPD"), which are electrically connected to the light-emitting elements LE located in the emission areas EA of the at least one sub-display area SBDA, is substantially the same as the main light-emitting pixel driver EPD, except that each of the light-emitting pixel drivers EPD' further includes a reset unit RSTP.

In the case of the light-emitting elements LE located in the at least one sub-display area SBDA, a leakage current is generated due to the light incident to, or emitted from, at least one optical device 18, so they may exhibit luminance characteristics that are different from those of the light-emitting elements LE of the main display area MDA.

To reduce or prevent the likelihood of the above occurring, the sub-light-emitting pixel driver EPD' may further include the reset unit RSTP configured to transmit a reset power VRST of a reset power line VRSL to the light-emitting element LE based on a reset control signal RSC of a reset control line RSCL. That is, the reset unit RSTP may be electrically connected to the anode electrode 131 of the light-emitting element LE along with the sixth transistor T6 and the seventh transistor T7, and may adjust the potential of the anode electrode 131 to the reset power VRST in response to the reset control signal RSC. For example, the reset unit RSTP may include a ninth transistor T9 electrically connected between the reset power line and the light-emitting element LE.

The gate electrode of the ninth transistor T9 may be electrically connected to the reset control line RSCL.

This reset unit RSTP enables the adjustment of the potential of the anode electrode 131 of the light-emitting element LE to the reset power VRST. Therefore, a difference in luminance between the at least one sub-display area SBDA and the main display area MDA due to the light of the at least one optical device 18 can be reduced or prevented.

Meanwhile, according to embodiments, the at least one sub-display area SBDA is surrounded by the main display area MDA. Therefore, the display device 100 according to the embodiments may be suitably equipped with a reset transmission line located in the main display area MDA to transmit the reset power VRST and the reset control signal RSC to the at least one sub-display area SBDA.

As will be described later, according to embodiments, the reset transmission line may be provided as part of the dummy lines.

Figure 12:
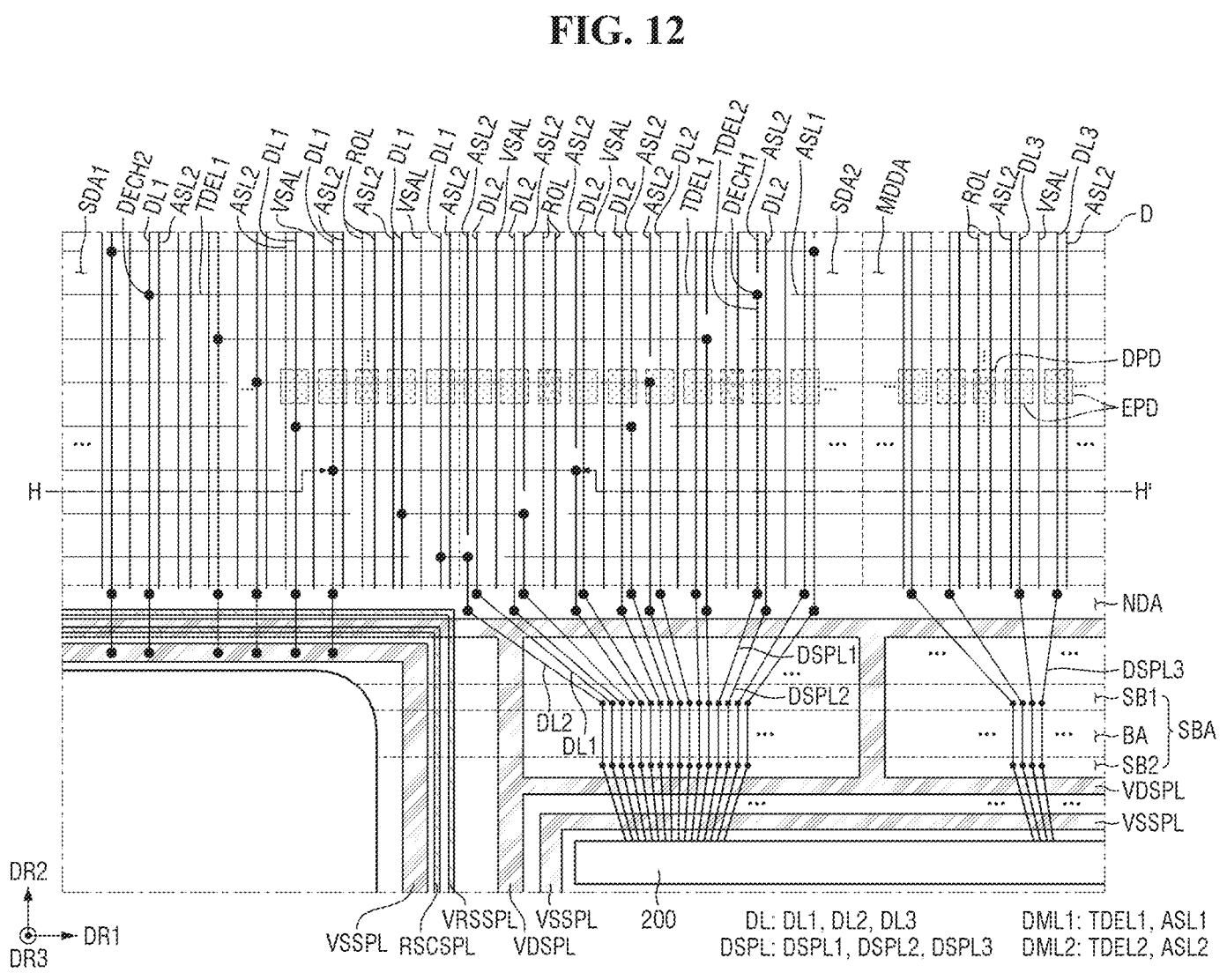
Figure 13:
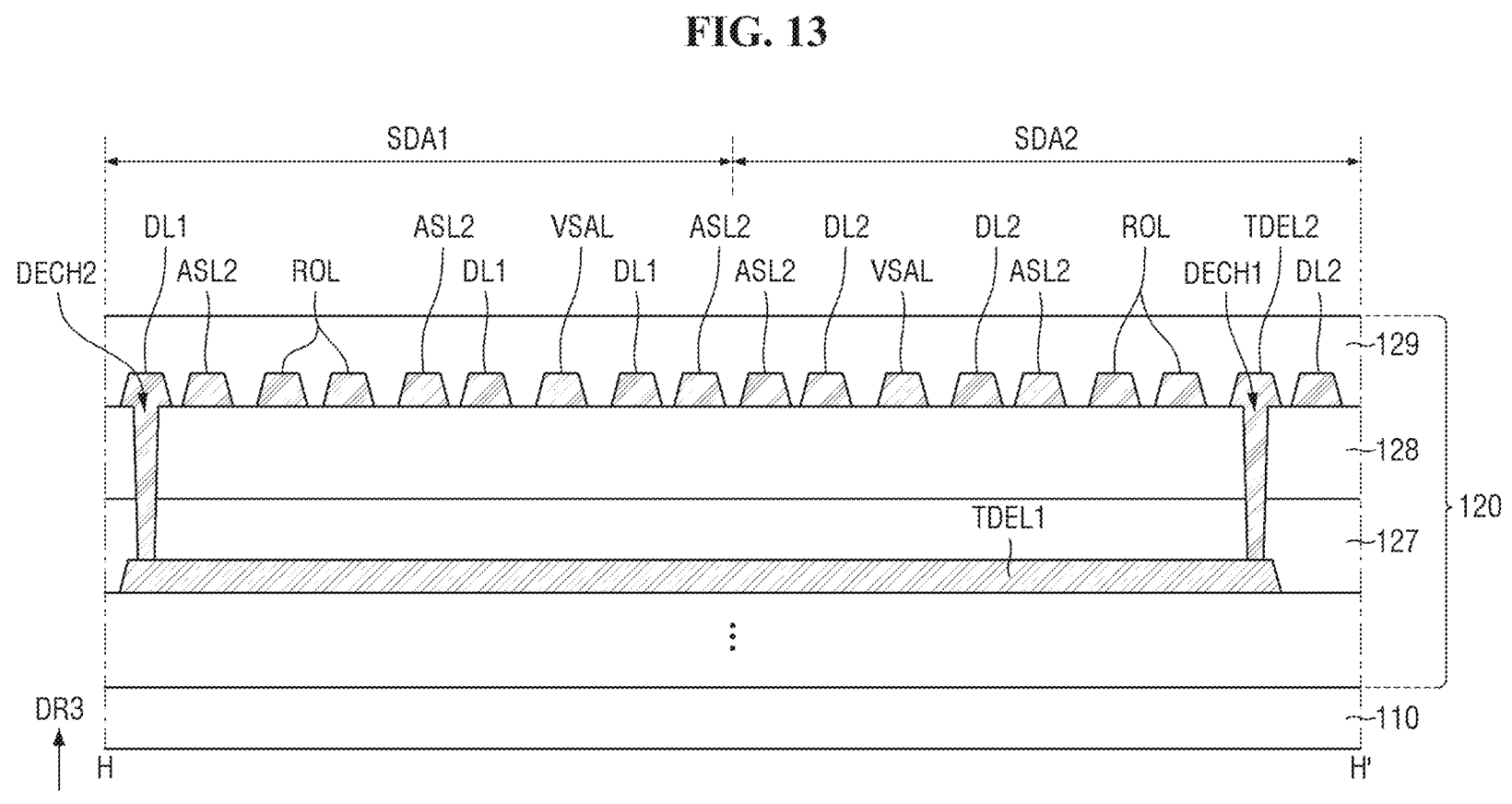

FIG. 12 is a layout diagram illustrating part D of FIG. 3. FIG. 13 is a cross-sectional view taken along the line H-H' of FIG. 12.

As shown in FIG. 3 above, the display area DA may include the bypass area DEA located on one side in the second direction DR2 adjacent to the sub-region SBA. The bypass area DEA may include: the bypass middle area MDDA located at the center in the first direction DR1; the first bypass side area SDA1 parallel to the bypass middle area MDDA in the first direction DR1 and in contact with the non-display area NDA; and the second bypass side area SDA2 located between the bypass middle area MDDA and the first bypass side area SDA1.

Referring to FIG. 12, the circuit layer 120 of the display device 100 according to embodiments may include: the light-emitting pixel drivers EPD (EPD') electrically respectively connected to the light-emitting elements LE of the element layer 130 respectively located in the emission areas EA; the data lines DL that transmit the data signal Vdata to the light-emitting pixel drivers EPD (EPD'); first dummy lines DML1 extending in the first direction DR1 crossing the data lines DL; and second dummy lines DML2 extending parallel to the data lines DL and respectively paired with the data lines DL.

The data lines DL and the second dummy lines DML2 may extend in the second direction DR2.

According to embodiments, the circuit layer 120 may further include data supply line DSPL located in the non-display area NDA and electrically connected to the display driving circuit 200. The data supply lines DSPL electrically connect the display driving circuit 200 to the data lines DL.

The data lines DL may include a first data line DL1 located in the first bypass side area SDA1, and a second data line DL2 located in the second bypass side area SDA2.

The first dummy lines DML1 may include a first transmission bypass line TDEL1 electrically connected to the first data line DL1 of the first bypass side area SDA1.

The second dummy lines DML2 may include a second transmission bypass line TDEL2 paired with the second data line DL2 of the second bypass side area SDA2, and electrically connected to the first transmission bypass line TDEL1.

The data supply lines DSPL may include a first data supply line DSPL1 that transmits the data signal of the first data line DL1, and a second data supply line DSPL2 that transmits the data signal of the second data line DL2. The first data supply line DSPL1 may be electrically connected to the second transmission bypass line TDEL2.

The first transmission bypass line TDEL1 may be electrically connected to the second transmission bypass line TDEL2 through a first bypass connection hole DECH1, and may be electrically connected to the first data line DL1 through a second bypass connection hole DECH2.

Referring to FIG. 13, the second dummy lines DML2 including the second transmission bypass line TDEL2 and a second auxiliary line ASL2 may be located as the third source-drain conductive layer on the second planarization layer 128, in the same way as the first data line DL1 and the second data line DL2.

The first dummy lines DML1 including the first transmission bypass line TDEL1 may be located as a conductive layer under the second planarization layer 128. For example, the first dummy lines DML1 including the first transmission bypass line TDEL1 may be located as the first source-drain conductive layer on the second interlayer insulating layer 126, and may be covered with the first planarization layer 127. In this case, the first bypass connection hole DECH1 and the second bypass connection hole DECH2 may penetrate the second planarization layer 128 and the first planarization layer 127.

As stated above, according to embodiments, the first data line DL1 of the first bypass side area SDA1 may be electrically connected to the first data supply line DSPL1 extended to the second bypass side area SDA2 through the first transmission bypass line TDEL1 and the second transmission bypass line TDEL2 located in the bypass area DEA of the display area DA.

In other words, even if the first data supply line DSPL1 extends only to the second bypass side area SDA2 relatively adjacent to the sub-region SBA, like the second data supply line DSPL2, electrical connection between the first data supply line DL1 and the first data supply line DSPL1 may be achieved through the first transmission bypass line TDEL1 and the second transmission bypass line TDEL2.

Therefore, because the first data supply line DSPL1 does not extend relatively long from the sub-region SBA to the first bypass side area SDA1 adjacent to the bent edge of the substrate 110, and the first data supply line DSPL1 is not located at a portion of the non-display area NDA between the bent edge of the substrate 110 and the first bypass side area SDA1, the width of the non-display area NDA may be reduced.

The second data supply line DSPL2 may extend to the second bypass side area SDA2, and may be electrically connected to the second data line DL2 directly.

The data lines DL may further include a third data line DL3 located in the bypass middle area MDDA. In addition, the data supply lines DSPL may further include a third data supply line DSPL3 that transmits the data signal of the third data line DL3. The third data supply line DSPL3 may extend to the bypass middle area MDDA, and may be electrically connected to the third data line DL3 directly.

The first transmission bypass line TDEL1 extends from the second transmission bypass line TDEL2 to the first data line DL1. The second transmission bypass line TDEL2 extends from the first data supply line DSPL1 of the non-display area NDA to the first transmission bypass line TDEL1.

In this way, as the first transmission bypass line TDEL1 and the second transmission bypass line TDEL2 are limitedly arranged in the bypass area DEA, the ends of the first transmission bypass line TDEL1 and the ends of the second transmission bypass line TDEL2 are arranged with regularity. Accordingly, visibility of the first transmission bypass line TDEL1 and the second transmission bypass line TDEL2 may be increased.

To reduce or prevent the likelihood of the above occurring, the first dummy lines DML1 may further include first auxiliary lines ASL1 as well as the first transmission bypass line TDEL1. In addition, the second dummy lines DML2 may further include the second auxiliary line ASL2 as well as the second transmission bypass line TDEL2.

Two of the first auxiliary lines ASL1 may extend to the non-display area NDA at both ends of the first transmission bypass line TDEL1. One of the second auxiliary lines ASL2 may extend from one end of the second transmission bypass line TDEL2 to the non-display area NDA in a direction away from the sub-region SBA.

Accordingly, some of the second data lines DL2 may be paired with the second transmission bypass line TDEL2, and others thereof may be paired with the one second auxiliary line ASL2 extending from the one end of the second transmission bypass line TDEL2.

Because the second transmission bypass line TDEL2 is located only in the second bypass side area SDA2, the first data line DL1 of the first bypass side area SDA1 may be paired with the second auxiliary line ASL2 as a whole.

In addition, the third data line DL3 of the bypass middle area MDDA may be paired with the second auxiliary line ASL2 as a whole.

The circuit layer 120 may further include a first power supply line VDSPL and a second power supply line VSSPL that respectively transmit the first power ELVDD and the second power ELVSS for driving the light-emitting elements LE.

The first power supply line VDSPL and the second power supply line VSSPL may be located in the non-display area NDA and may extend to the sub-region SBA. The first power supply line VDSPL may be electrically connected to a first power pad for the transmission of the first power ELVDD among signal pads located in the second sub-region SB2.

The second power supply line VSSPL may be electrically connected to a second power pad for the transmission of the second power ELVSS among the signal pads located in the second sub-region SB2.

The first auxiliary lines ASL1 may be electrically connected to the second power supply line VSSPL. The second auxiliary lines ASL2 may be electrically connected to the first auxiliary lines ASL1 and the second power supply line VSSPL.

According to embodiments, the circuit layer 120 may be located on the same layer as the data lines DL and the second dummy lines DML2, and may further include a second power auxiliary line VSAL that transmits the second power ELVSS.

According to embodiments, the display device 100 may have a scanning function for detecting the curvature of an object in contact with a screen based on a difference in the amount of light reflected from the screen.

To this end, the display device 100 may further include light-sensing elements distributed in the display area DA, and a scanning driving circuit that periodically collects light-sensing signals of the light-sensing elements.

The light-sensing elements may be located in light-sensing areas ODA dispersed in the non-emission area NEA.

In this case, the circuit layer 120 may further include light-sensing pixel drivers DPD electrically connected to light-sensing element, respectively, and read-out lines ROL electrically connected to the light-sensing pixel drivers DPD. The read-out lines ROLs may extend in the second direction DR2, in parallel with the data lines DL.

Meanwhile, according to embodiments, the circuit layer 120 may further include a reset power supply line VRSSPL and a reset control supply line RSCSPL extending from the sub-region SBA and located in the non-display area NDA to transmit the reset power VRST and the reset control signal RSC, respectively.

In addition, the second dummy lines DML2 include reset transmission lines RSTL (see FIGS. 14 and 15) extending from the reset power supply line VRSSPL and the reset control supply line RSCSPL to the at least one sub-display area SBDA. That is, the reset transmission lines RSTL located in the main display area MDA for transmitting the reset power VRST and the reset control signal RSC may be provided as part of the second dummy lines DML2.

Figure 14:
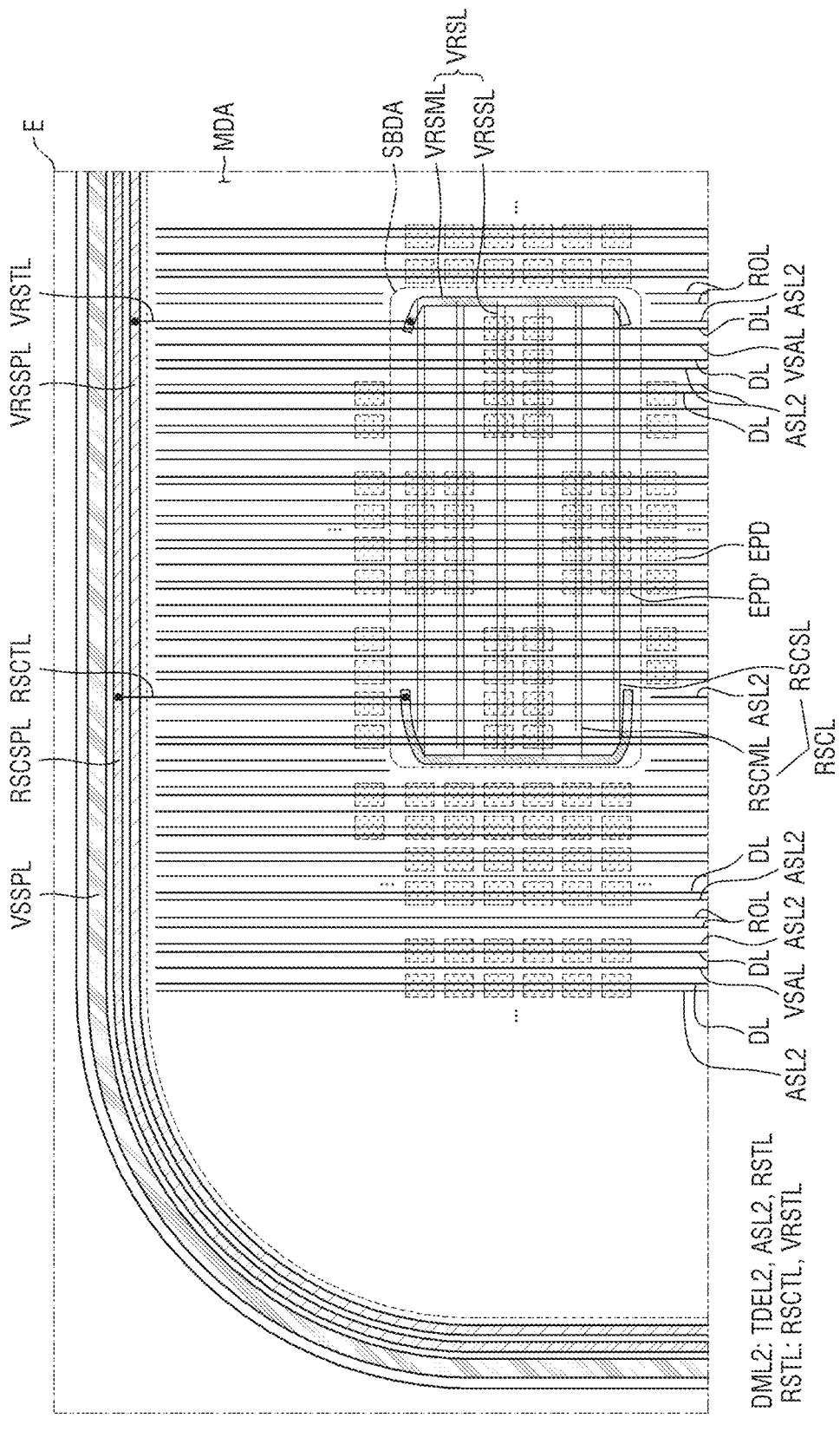
FIG. 14 is a layout diagram showing part E of FIG. 3 according to one or more embodiments.

FIG. 14 is a layout diagram showing part E of FIG. 3 according to one or more embodiments.

Referring to FIG. 14, the circuit layer 120 of the display device 100 according to one or more embodiments includes second dummy lines DML2 respectively paired with the data lines DL, and the second dummy line DML2 includes not only the second bypass transmission line TDEL2 and the second auxiliary lines ASL2, but also includes the transmission lines RSTL extending from the non-display area NDA to the at least one sub-display area SBDA. The reset transmission lines RSTL may be located in the main display area MDA.

The circuit layer 120 may further include the reset power line VRSL and the reset control line RSCL located in the at least one sub-display area SBDA.

The reset power line VRSL may include a reset power main line VRSML located adjacent to at least a portion of the edge of the sub-display area SBDA, and reset power sub-lines VRSSL extending from the reset power main line VRSML in the first direction DR1.

The reset control line RSCL may include a reset control main line RSCML located adjacent to at least a portion of the edge of the sub-display area SBDA, and reset control sub-lines RSCSL extending from the reset control main line RSCML in the first direction DR1.

For example, the reset power main line VRSML and the reset control main line RSCML may be located along different edges of the sub-display area SBDA, and may face each other in the first direction DR1.

The reset power sub-lines VRSSL and the reset control sub-lines RSCSL may overlap the sub-light-emitting pixel drivers EPD'.

A reset power transmission line VRSTL provided as part of the second dummy lines DML2 may electrically connect the reset power line VRSL and the reset power supply line VRSSPL of the non-display area NDA. For example, the reset power main line VRSML may extend to the reset power transfer line VRSTL in the first direction DR1, and the reset power transmission line VRSTL may be electrically connected to the reset power main line VRSML.

A reset control transmission line RSCTL provided as another part of the second dummy lines DML2 may electrically connect the reset control line RSCL and the reset control supply line RSCSL of the non-display area NDA. For example, the reset control main line RSCML may extend to the reset control transmission line RSCTL in the first direction DR1, and the reset control transmission line RSCTL may be electrically connected to the reset control main line RSCML.

As described above, according to one or more embodiments, to transmit the reset power VRST and the reset control signal RSC to the reset unit RSTP of the sub-light-emitting pixel driver EPD' located in the at least one sub-display area SBDA, the reset transmission lines RSTL located in the main display area MDA may be provided as part of the second dummy lines DML including the second transmission bypass line TDEL2.

That is, because the reset transmission lines RSTL are provided as part of the second dummy lines DML2 rather than a separate line pattern, the visibility of the reset transmission lines RSTL may be lowered. Besides, because some of the display area DA are not allocated to the arrangement of the reset transmission lines RSTL, the ratio of the area in which the light-emitting pixel drivers EPD (EPD') are located in the display area DA may increase, which may be advantageous for achieving high resolution.

Meanwhile, according to one or more embodiments, the reset unit RSTP may operate irregularly depending on whether or not the at least one optical device 18 is driven.

That is, the reset control signal RSC of a turn-on level may be irregularly applied to the reset unit RSTP. Accordingly, the polarity of the reset control signal RSC may be changed frequently regardless of an image frame period.

Meanwhile, because the reset transmission lines RSTL are placed in the main display area MDA, the light-emitting pixel drivers EPD or the emission areas EA adjacent to the reset control transmission line RSCTL may be affected by the coupling of the reset control signal RSC. As a result, the luminance characteristics of the emission areas EA adjacent to the reset control transmission line RSCTL may become different from those of the other emission areas EA around them, which may lead to stain defects.

In this regard, one or more other embodiments for alleviating a defect due to the reset control signal RSC of the reset control transmission line RSCTL is provided as follows.

Figure 15:
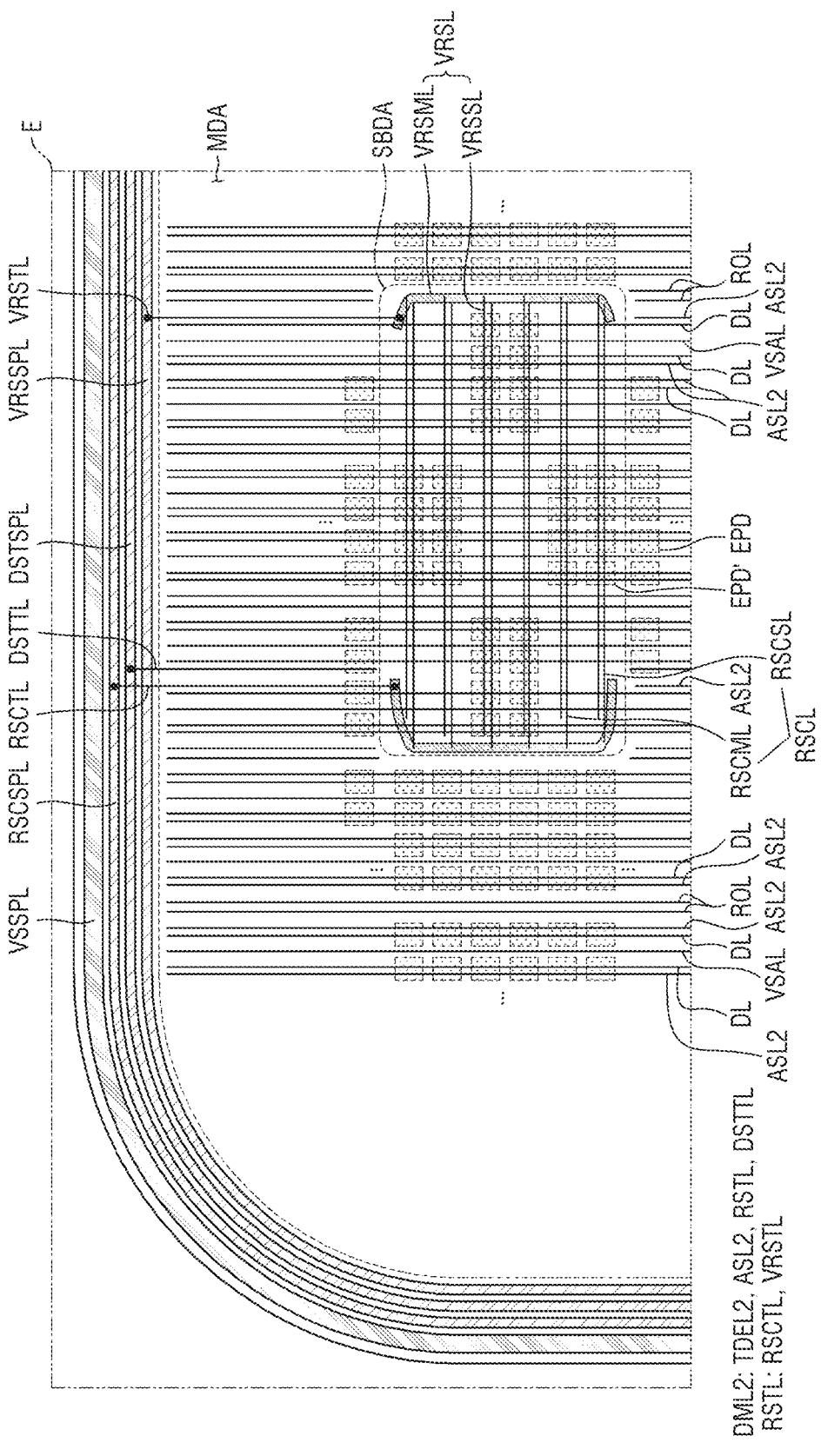
FIG. 15 is a layout diagram showing part E of FIG. 3 according to one or more other embodiments.
Figure 16:
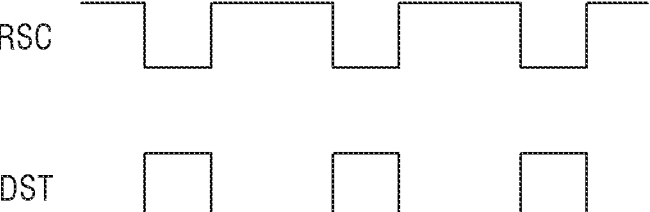
FIG. 16 is a waveform diagram illustrating a reset control signal of the reset control transmission line of FIG. 15 and an offset signal of an offset line.

FIG. 15 is a layout diagram showing part E of FIG. 3 according to one or more other embodiments. FIG. 16 is a waveform diagram illustrating a reset control signal of the reset control transmission line of FIG. 15 and an offset signal of an offset line.

Referring to FIG. 15, the display device 100 according to one or more other embodiments is substantially the same as the one or more embodiments corresponding to FIG. 14 except that the circuit layer 120 is located in the non-display area NDA, and further includes an offset signal supply line DSTSPL for transmitting an offset signal DST (see FIG. 16) having a polarity that is opposite to that of the reset control signal RSC, and the second dummy lines DML2 further include an offset line DSTTL adjacent to the reset control transmission line RSCTL and electrically connected to the offset signal supply line DSTSPL. Thus, redundant description will be omitted below.

According to one or more other embodiments, between two data lines DL respectively overlapping two adjacent light-emitting pixel drivers EPD (EPD') among the data lines, two second dummy lines DML2 respectively paired with the two data lines DL and adjacent to each other among the second dummy lines DML2 may be located.

Accordingly, the reset control transmission line RSCTL and offset line DSTTL adjacent to each other may be provided as some of the second dummy lines DML2.

Referring to FIG. 16, the offset signal DST transmitted to the offset signal supply line DSTSPL and the offset line DSTTL may have a polarity opposite to that of the reset control signal RST.

In this way, the reset control signal RSC of the reset control transmission line RSCTL and the offset signal DST of the offset line DSTTL may be mutually interfered and offset. Therefore, the coupling effect of the reset control signal RSC on the emission areas EA or the light-emitting pixel drivers EPD adjacent to the reset control transmission line RSCTL in the main display area MDA may be alleviated.

However, the effects of the present disclosure are not restricted to the one set forth herein. The above and other effects of the present disclosure will become more apparent to one of daily skill in the art to which the present disclosure pertains by referencing the claims, with functional equivalents thereof to be included therein.

What is claimed is:

1. A display device comprising:

a substrate comprising a display area comprising emission areas, and a non-display area around the display area;

a circuit layer above the substrate; and an element layer above the circuit layer, and comprising light-emitting elements respectively corresponding to the emission areas, wherein the display area comprises a main display area in which the emission areas are arranged side by side, and at least one sub-display area surrounded by the main display area, wherein the at least one sub-display area further comprises light transmission areas between the emission areas, and wherein the circuit layer comprises:

first dummy lines extending in a first direction; and second dummy lines extending in a second direction crossing the first direction, and comprising reset transmission lines extending from the non-display area to the at least one sub-display area.

2. The display device of claim 1, wherein the circuit layer further comprises:

light-emitting pixel drivers respectively electrically connected to the light-emitting elements of the element layer;

data lines configured to transmit data signals to the light-emitting pixel drivers, extending in the second direction, and respectively paired with the second dummy lines; and data supply lines in the non-display area, and electrically connected to the data lines, respectively, wherein a bypass area on one side of the display area comprises a bypass middle area, a first bypass side area parallel to the bypass middle area in the first direction and contacting the non-display area, and a second bypass side area between the bypass middle area and the first bypass side area, wherein the data lines comprise a first data line in the first bypass side area, and a second data line in the second bypass side area, wherein the first dummy lines comprise a first transmission bypass line electrically connected to the first data line, wherein the second dummy lines further comprise a second transmission bypass line paired with the second data line and electrically connected to the first transmission bypass line, wherein, from among the data supply lines, a first data supply line configured to transmit a first data signal of the first data line is electrically connected to the first data line through the first transmission bypass line and the second transmission bypass line.

3. The display device of claim 2, wherein, from among the data supply lines, a second data supply line configured to transmit a second data signal of the second data line is directly electrically connected to the second data line.

4. The display device of claim 2, further comprising a display driving circuit configured to output the data signals of the data lines, wherein the data supply lines electrically connected between the data lines and the display driving circuit.

5. The display device of claim 2, wherein the circuit layer further comprises a first power supply line and a second power supply line configured to respectively transmit a first power and a second power for driving the light-emitting elements, wherein the first dummy lines further comprise first auxiliary lines electrically connected to the second power supply line, and wherein the second dummy lines further comprise second auxiliary lines electrically connected to the first auxiliary lines and the second power supply line.

6. The display device of claim 5, wherein two of the first auxiliary lines extend from respective sides of the first transmission bypass line to the non-display area, and wherein one of the second auxiliary lines extends from one side of the second transmission bypass line to the non-display area.

7. The display device of claim 5, wherein, from among the light-emitting pixel drivers, one light-emitting pixel driver in the main display area comprises:

a first transistor configured to generate a driving current for driving one light-emitting element from among the light-emitting elements;

a second transistor electrically connected between one of the data lines and a first electrode of the first transistor;

a third transistor electrically connected between a gate electrode of the first transistor and a second electrode of the first transistor;

a fourth transistor electrically connected between a first initialization power line configured to transmit a first initialization power and the gate electrode of the first transistor;

a fifth transistor electrically connected between a first power line configured to transmit the first power and the first electrode of the first transistor;

a sixth transistor electrically connected between the second electrode of the first transistor and the one light-emitting element;

a seventh transistor electrically connected between a second initialization power line configured to transmit a second initialization power and the one light-emitting element; and an eighth transistor electrically connected between a bias power line configured to transmit a bias power and the first electrode of the first transistor.

8. The display device of claim 7, wherein the at least one sub-display area overlaps at least one optical device, wherein, from among the light-emitting pixel drivers, another light-emitting pixel driver in the at least one sub-display area is electrically connected to another light-emitting element from among the light-emitting elements, and wherein the display device further comprises a reset unit configured to transmit a reset power to the another light-emitting element via a reset power line based on a reset control signal of a reset control line.

9. The display device of claim 8, wherein the reset unit comprises a ninth transistor electrically connected between the reset power line and the another light-emitting element, and wherein a gate electrode of the ninth transistor is electrically connected to the reset control line configured to transmit the reset control signal.

10. The display device of claim 8, wherein the circuit layer further comprises:

a reset power supply line in the non-display area, the reset power supply line being configured to transmit the reset power; and a reset control supply line in the non-display area, the reset control supply line being configured to transmit the reset control signal, and wherein the reset transmission lines comprise:

a reset power transmission line electrically connecting the reset power supply line and the reset power line; and a reset control transmission line electrically connecting the reset control supply line and the reset control line.

11. The display device of claim 10, wherein two adjacent ones of the second dummy lines are located between, and are respectively paired with, two of the data lines respectively overlapping two adjacent ones of the light-emitting pixel drivers.

12. The display device of claim 11, wherein the second dummy lines further comprise an offset line adjacent to the reset control transmission line, the offset line being configured to transmit an offset signal having a polarity that is opposite to that of the reset control signal.

* * * * *